(12) United States Patent
Manning et al.

(10) Patent No.: US 9,704,540 B2
(45) Date of Patent: Jul. 11, 2017

(54) APPARATUSES AND METHODS FOR PARITY DETERMINATION USING SENSING CIRCUITRY

(71) Applicant: Micron Technology, Inc., Boise, ID (US)

(72) Inventors: Troy A. Manning, Meridian, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 14/713,724

(22) Filed: May 15, 2015

(65) Prior Publication Data

US 2015/0357007 A1 Dec. 10, 2015

Related U.S. Application Data

(60) Provisional application No. 62/008,035, filed on Jun. 5, 2014.

(51) Int. Cl.
*G11C 29/00* (2006.01)
*G11C 7/06* (2006.01)
(Continued)

(52) U.S. Cl.
CPC .............. *G11C 7/06* (2013.01); *G06F 11/10* (2013.01); *G06F 11/1048* (2013.01); *G11C 7/10* (2013.01);
(Continued)

(58) Field of Classification Search
CPC .. G06F 11/1048; G06F 11/10; G06F 11/1064; G06F 11/1032; G06F 11/1008;
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
(Continued)

*Primary Examiner* — Guerrier Merant
(74) *Attorney, Agent, or Firm* — Brooks, Cameron & Huebsch, PLLC

(57) ABSTRACT

The present disclosure includes apparatuses and methods related to parity determinations using sensing circuitry. An example method can include protecting, using sensing circuitry, a number of data values stored in a respective number of memory cells coupled to a sense line of an array by determining a parity value corresponding to the number of data values without transferring data from the array via an input/output line. The parity value can be determined by a number of XOR operations, for instance. The method can include storing the parity value in another memory cell coupled to the sense line.

36 Claims, 16 Drawing Sheets

(51) Int. Cl.
*G06F 11/10* (2006.01)
*G11C 7/10* (2006.01)
*G11C 7/22* (2006.01)
*G11C 7/24* (2006.01)
*G11C 11/4078* (2006.01)
*G11C 11/4091* (2006.01)

(52) U.S. Cl.
CPC .................. *G11C 7/22* (2013.01); *G11C 7/24* (2013.01); *G11C 11/4078* (2013.01); *G11C 11/4091* (2013.01)

(58) Field of Classification Search
CPC ......... G11C 7/06; G11C 11/4091; G11C 7/22; G11C 7/24; G11C 11/4078; G11C 7/10; G11C 15/00; G11C 7/1006; G11C 11/406; G11C 11/4096; G11C 2207/108; G11C 2207/002; G11C 2207/065
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,140,597 A * | 8/1992 | Araki ............ G06F 11/1008 365/200 |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,546,410 A * | 8/1996 | Ando ............ G06F 11/0754 714/764 |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,671,239 A * | 9/1997 | Higashitani ......... G06F 11/1008 714/805 |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |

(56) References Cited

U.S. PATENT DOCUMENTS

| | | |
|---|---|---|
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,503 B2 | 1/2016 | Brandt |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0007410 A1* | 1/2003 | Okuda ................ G06F 11/1032 365/230.03 |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0083421 A1* | 4/2004 | Foss ........................ G11C 15/00 714/805 |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0133166 A1* | 6/2006 | Kikutake ............ G06F 11/1032 365/201 |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0005244 A1* | 1/2010 | Weiberle ............ G06F 11/1658 711/130 |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0238885 A1* | 9/2011 | Kitahara ................ G06F 3/0613 711/103 |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | I436213 | 5/2014 |
| WO | 0165359 | 9/2001 |

(56) References Cited

FOREIGN PATENT DOCUMENTS

| WO | 2010079451 | 7/2010 |
|---|---|---|
| WO | 2013062596 A1 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al, "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Office Action for related Taiwan Patent Application No. 104118413, dated Aug. 22, 2016, 6 pages.
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, mailed Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
International Search Report and Written Opinion for related PCT Patent No. PCT/US2015/033651, dated Aug. 26, 2015, 14 pages.
Office Action for related Taiwan Patent Application No. 104118413, dated Apr. 19, 2017, 9 pages.

* cited by examiner

APPARATUSES AND METHODS FOR PARITY DETERMINATION USING SENSING CIRCUITRY

PRIORITY INFORMATION

This application is a Non-Provisional of U.S. Provisional Application No. 62/008,035, filed Jun. 5, 2014, the contents of which are incorporated herein by reference.

TECHNICAL FIELD

The present disclosure relates generally to semiconductor memory and methods, and more particularly, to apparatuses and methods related to parity determinations (e.g., calculations) using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block (referred to herein as functional unit circuitry (FUC)), for example, which can be used to execute instructions by performing logical operations such as AND, OR, NOT, NAND, NOR, and XOR logical operations on data (e.g., one or more operands). For example, the FUC may be used to perform arithmetic operations such as addition, subtraction, multiplication, and/or division on operands.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

Data stored in an array can be protected via various data protection schemes that may include error detection and/or error correction using an error correcting code (ECC) such as a Hamming Code or BCH (Bose Chaudhuri Hocquenghem) code. Such codes may be stored along with the data they are protecting and can be checked when the data is read to detect whether the data contains errors (e.g., erroneous bit values). Such codes may also be used to correct a certain number of errors that are detected. However, to check the ECC code, the protected data must be read out of the array and provided to an ECC engine (e.g., by transferring the data via an input/output (I/O) line).

BRIEF DESCRIPTION OF THE DRAWINGS

FIGS. 5B-1 and 5B-2 illustrate timing diagrams associated with performing a number of logical operations using sensing circuitry in accordance with a number of embodiments of the present disclosure.

FIGS. 5C-1 and 5C-2 illustrate timing diagrams associated with performing a number of logical operations using sensing circuitry in accordance with a number of embodiments of the present disclosure.

DETAILED DESCRIPTION

Figure 1:
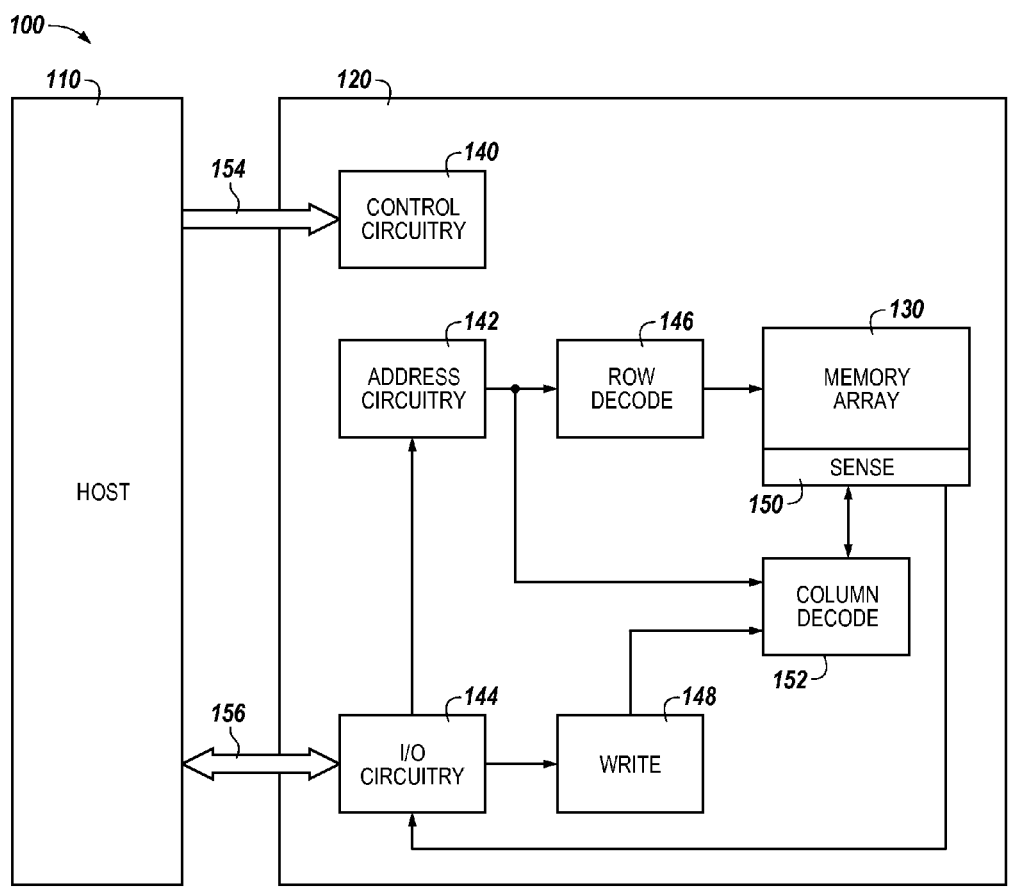
FIG. 1 is a block diagram of an apparatus in the form of a computing system including a memory device in accordance with a number of embodiments of the present disclosure.

The present disclosure includes apparatuses and methods for parity determinations using sensing circuitry. An example method can include protecting data values stored in a respective number of memory cells coupled to a sense line of an array via a parity value corresponding to the number of data values that is determined without transferring data from the array via an input/output (I/O) line; and storing the parity value in another memory cell coupled to the sense line.

In a number of embodiments of the present disclosure a parity value used to protect a number of data values stored in an array can be determined by performing a number of exclusive OR (XOR) operations in memory (e.g., without transferring data out of the array via an I/O line such as through a sense line address access and/or without enabling a column decode line). As used herein, a parity value can refer to a data value that indicates whether particular data (e.g., a number of bits) includes an even or odd number of a particular data value (e.g., an odd or even number of "1s" or "0s"). The parity value corresponding to particular data stored in a number of memory cells can be checked to determine whether the data being protected is erroneous (e.g., whether the data includes one or more erroneous bits). For example, a parity value corresponding to a number of protected data values can be determined and if a subsequent check of the parity value indicates a different parity value, the protected data may contain an error. Upon determination that the protected data may contain an error (e.g., that one of the protected data values is erroneous), corrective action can be taken (e.g., to correct the erroneous data value). As an example, when an erroneous data value is detected, the parity value can be incorporated into a number of XOR operations performed on the protected data values to determine a correction for the erroneous data value. For example, consider a group of memory cells coupled to a particular sense line (e.g., digit line) and storing data values protected by a parity value also stored in another memory cell coupled to the particular sense line. Upon a determination that the data value stored in a memory cell of the group coupled to a particular access line, a number of XOR operations can be performed on the data values stored in the other memory cells of the group (e.g., all other memory cells storing data protected by the parity value) along with the parity value. The result from the number of XOR operations can be written to the memory cell coupled to the particular access line such that the memory cell stores the correct data value.

As described further herein, in a number of embodiments, sensing circuitry coupled to an array of memory cells can be operated to determine, in parallel, parity values corresponding to "N" operands each comprising a number of data values stored in the memory cells of a particular digit line, with N representing the quantity of digit lines corresponding to the array.

As will be described further herein, in a number of embodiments, the parity value calculation(s) can be made without transferring data from a memory array via an input/output (I/O) line (e.g., via a local I/O line in association with sense line address access). For instance, sensing circuitry (e.g., sensing circuitry described in FIGS. 2 and 4) can be operated to perform a number of logical operations (e.g., AND, OR, NAND, NOR, NOT) in association with parity value calculations without transferring data via a sense line address access (e.g., without firing a column decode signal). Performing such logical operations using sensing circuitry, rather than with processing resources external to the sensing circuitry (e.g., by a processor associated with a host and/or other processing circuitry, such as ALU circuitry) can provide benefits such as reducing system power consumption, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "T," "U," etc., particularly with respect to reference numerals in the drawings, can indicate that a number of the particular features so designated can be included. As used herein, "a number of" a particular thing can refer to one or more of such things (e.g., a number of memory arrays can refer to one or more memory arrays).

The figures herein follow a numbering convention in which the first data unit or data units correspond to the drawing figure number and the remaining data units identify an element or component in the drawing. Similar elements or components between different figures may be identified by the use of similar data units. For example, 130 may reference element "30" in FIG. 1, and a similar element may be referenced as 430 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as row lines, word lines, or select lines) and columns coupled by sense lines (which may be referred to herein as bit lines, digit lines, or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 4.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller (e.g., an on-die controller).

An example of the sensing circuitry 150 is described further below in association with FIGS. 2 through 6. For instance, in a number of embodiments, the sensing circuitry 150 can comprise a number of sense amplifiers (e.g., sense amplifiers 206-1, . . . , 206-U shown in FIG. 2 or sense amplifier 406 shown in FIG. 4) and a number of compute components (e.g., compute components 231-1 through 231-X shown in FIG. 2 and compute component 431 shown in FIG. 4). As illustrated in FIG. 4, the compute components can comprise cross-coupled transistors that can serve as data latches and can be coupled to other sensing circuitry used to perform a number of logical operations (e.g., AND, NOT, NOR, NAND, XOR, etc.). In a number of embodiments, the sensing circuitry (e.g., 150) can be used to perform logical operations in association with parity calculations in accordance with embodiments described herein, without transferring data via a sense line address access (e.g., without firing a column decode signal). As such, logical operations can be performed within array 130 using sensing circuitry 150 rather than being performed by processing resources external to the sensing circuitry (e.g., by a processor associated with host 110 and/or other processing circuitry, such as ALU circuitry, located on device 120 (e.g., on control circuitry 140 or elsewhere)).

Figure 2:
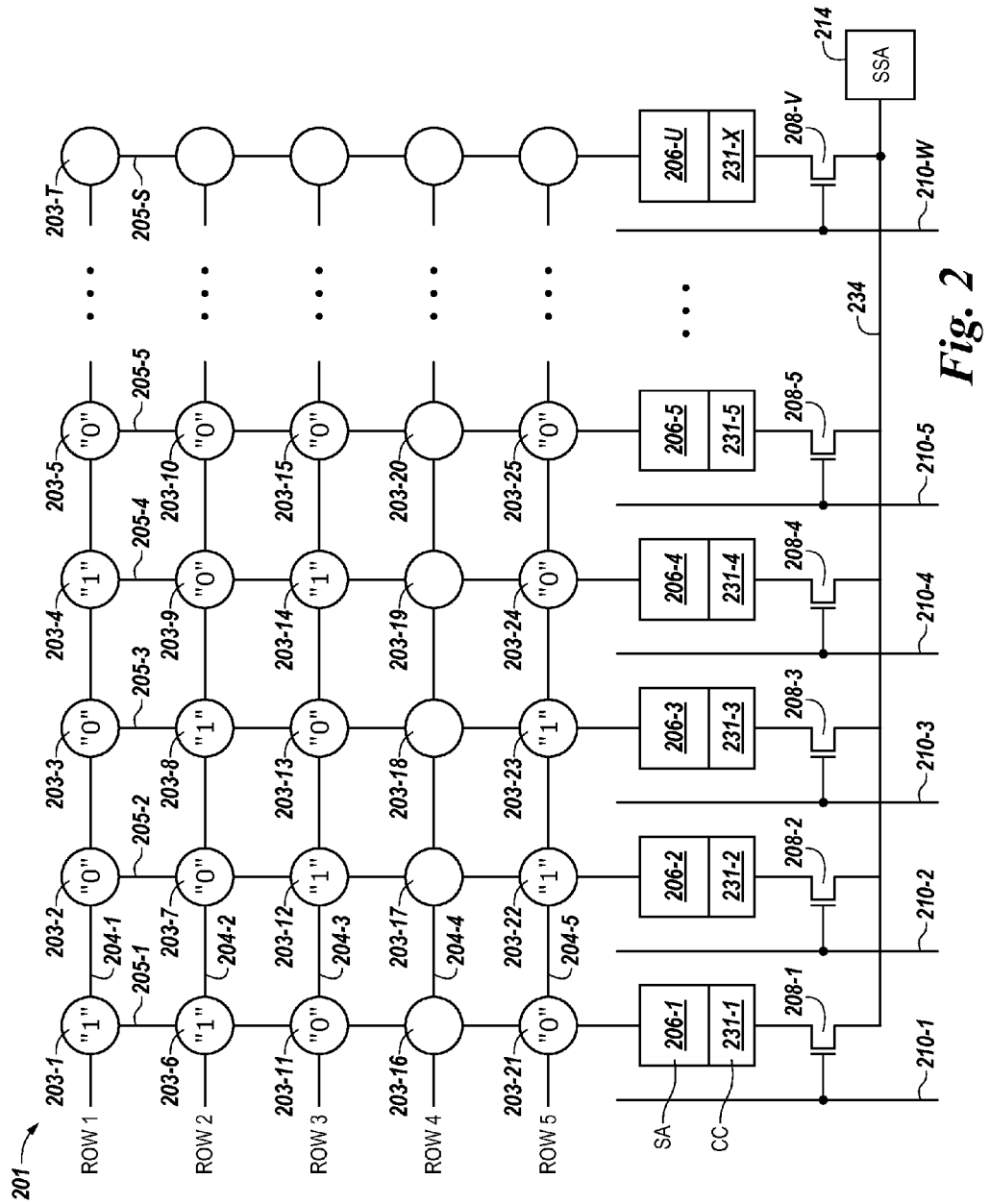
FIG. 2 illustrates a schematic diagram of a portion of a memory array coupled to sensing circuitry in accordance with a number of embodiments of the present disclosure.

FIG. 2 illustrates a schematic diagram of a portion of a memory array 201 coupled to sensing circuitry in accordance with a number of embodiments of the present disclosure. The memory cells 203-1 to 203-T (referred to generally as memory cells 203) of the memory array 201 are arranged in rows coupled to access lines (e.g., word lines) 204-1, 204-2, 204-3, 204-4, and 204-5 and columns coupled to sense lines (e.g., digit lines) 205-1, 205-2, 205-3, 205-4, 205-5, . . . , 205-S. For instance, access line 204-1 includes cells 203-1, 203-2, 203-3, 203-4, 203-5, . . . , 203-T. Memory array 201 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines D 405-1 and D_405-2 described in FIG. 4).

Each column of memory cells can be coupled to sensing circuitry (e.g., sensing circuitry 150 shown in FIG. 1). In this example, the sensing circuitry comprises a number of sense amplifiers 206-1, 206-2, 206-3, 206-4, 206-5, . . . , 206-U coupled to the respective sense lines. The sense amplifiers 206-1 to 206-U are coupled to input/output (I/O) line 234 (e.g., a local I/O line) via transistors 208-1, 208-2, 208-3, 208-4, 208-5, . . . , 208-V. In this example, the sensing circuitry also comprises a number of compute components 231-1, 231-2, 231-3, 231-4, 231-5, . . . , 231-X coupled to the respective sense lines. Column decode lines 210-1 to 210-W are coupled to the gates of transistors 208-1, 208-2, 208-3, 208-4, 208-5, . . . , 208-V and can be selectively enabled to transfer data sensed by respective sense amps 206-1 to 206-U and/or stored in respective compute components 231-1 to 231-X to a secondary sense amplifier 214.

FIG. 2 indicates example data values stored in the memory cells 203 of array 201. In this example, cells 203-1, 203-6, and 203-11 coupled to sense line 205-1 store data values "1," "1," and "0," respectively, and cell 203-21, also coupled to sense line 205-1, stores a parity value of "0" corresponding to the data values (e.g., "1," "1," and "0") stored in cells 203-1, 203-6, and 203-11. As such, the parity value stored in cell 203-11 protects (e.g., secures) the corresponding data values stored in cells 203-1, 203-6, and 203-11. Cells 203-2, 203-7, and 203-12 coupled to sense line 205-2 store data values "0," "0," and "1," respectively, and cell 203-22, also coupled to sense line 205-2, stores a parity value of "1" corresponding to the data values (e.g., "0," "0," and "1") stored in cells 203-2, 203-7, and 203-12. Cells 203-3, 203-8, and 203-13 coupled to sense line 205-3 store data values "0," "1," and "0," respectively, and cell 203-23, also coupled to sense lines 205-3, stores a parity value of "1" corresponding to the data values (e.g., "0," "1," and "0") stored in cells 203-3, 203-8, and 203-13. Cells 203-4, 203-9, and 203-14 coupled to sense line 205-4 store data values "1", "0," and "1," respectively, and cell 203-24, also coupled to sense line 205-4, stores a parity value of "0" corresponding to the data values (e.g., "1," "0," and "1") stored in cells 203-4, 203-9, and 203-14. Cells 203-5, 203-10, and 203-15 coupled to sense line 205-5 store data values "0," "0," and "0," respectively, and cell 203-25, also coupled to sense line 205-5, stores a parity value of "0" corresponding to the data values (e.g., "0," "0," and "0") stored in cells 203-5, 203-10, and 203-15.

In the example shown in FIG. 2, the parity values are stored in memory cells coupled to a same sense line as the data they protect, and the parity values corresponding to the respective sense lines are stored in memory cells of a same access line (e.g., access line 204-5 in this example). In this manner, in a number of embodiments, a single row of memory cells (e.g., ROW 5), each storing a parity value protecting data values stored in cells of a particular sense line, can be used to protect an entire array (or sub-array) of stored data values. Access lines having cells coupled thereto which store data protected by a parity value can be referred to herein as "protected" rows. As such, access lines having cells coupled thereto which do not store data values to be protected by a parity value can be referred to as "unprotected" rows. In the example shown in FIG. 2, access lines 204-1, 204-2, and 204-3 represent protected rows, and access lines 204-4 and 204-5 are unprotected rows. Access line 204-5 can be referred to as a "parity row" because cells coupled to access line 204-5 store the parity values corresponding to protected data values of respective sense. Also, in this example, the cells coupled to unprotected access line 204-4 can be used to store intermediate results associated with determining parity values in accordance with embodiments described herein. In a number of embodiments, a number of the unprotected access lines (e.g., 204-4, and 204-5) may be non-addressable in that they may not be accessible to a host and/or user. For instance, in a number of embodiments, unprotected access lines containing cells used for storing intermediate results associated with parity calculations are non-addressable.

The parity values corresponding to the data values stored in memory cells of respective sense lines can be determined by performing a number of operations without transferring data out of the array via an I/O line. The number of operations performed to determine the parity values can include performing an exclusive OR (XOR) operation on the data values stored in the memory cells coupled to a particular sense line. As an example, a parity value can be determined for the data stored in memory cells 203-1, 203-6, and 203-11 by performing XOR operations on the data values stored in those memory cells (e.g., bit values "1," "1," and "0", respectively). For instance, a first XOR operation can be performed on the data values stored in memory cells 203-1 and 203-6 (e.g., bit values "1" and "1", respectively). The first XOR operation results in a bit value of "0" (e.g., "1" XOR "1" is "0"). The result of the first XOR operation (e.g., bit value "0") can be stored in another memory cell coupled to the particular sense line (e.g., memory cell 203-16). A second XOR operation can be performed on the result of the first XOR operation (e.g., bit value "0") and a data value stored in memory cell 203-11 (e.g., bit value "0"). The second XOR operation (on bit values "0" and "0") results in a bit value of "0" (e.g., "0" XOR "0" is "0"). The result of the second XOR operation (e.g., bit value "0") represents a parity value corresponding to the data values stored in cells 203-1, 203-6, and 203-11 and can be stored in memory cell 203-21 as such. As described further below, in a number of embodiments of the present disclosure, XOR operations can be performed without transferring data out of the array via an I/O line (e.g., without transferring data via a sense line address access). In a number of embodiments, performing an XOR operation on a pair of data values comprises performing a NAND operation on the pair of data values, performing an OR operation on the pair of data values, and then performing an AND operation on the NAND resultant value and the OR resultant value.

In a number of embodiments, parity values can be determined for data stored in an array (e.g., 201) on a sense line by sense line basis simultaneously. For example, XOR operations can be performed simultaneously on the data values stored in memory cells 203 of each respective sense line 205-1 to 205-S resulting in the determination of parity values corresponding to the respective sense lines in a simultaneous manner. In the example shown, the parity values respectively corresponding to sense lines 205-1 to 205-5 are stored in cells 203-21 to 203-25. The parity values corresponding to the data values stored in memory cells coupled to respective sense lines 203-2 to 203-5 can be determined in a similar manner as the parity value (e.g., "0") corresponding to the data values (e.g., "1," "1," and "0") stored in cells 203-1, 203-6, and 203-11 coupled to sense line 205-1 (as described in the example above). As shown in this example, a parity value of "1," which is stored in memory cell 203-22, is determined by performing XOR operations on the data values (e.g., bit values "0," "0," and "1") stored in memory cells 203-2, 203-7, and 203-12, respectively. A parity value of "1," which is stored in memory cell 203-23, is determined by performing XOR operations on the data values (e.g., bit values "0," "1," and "0") stored in memory cells 203-3, 203-8, and 203-13, respectively. A parity value of "0," which is stored in memory cell 203-24, is determined by performing XOR operations on the data values (e.g., bit values "1," "0," and "1") stored in memory cells 203-4, 203-9, and 203-14, respectively. Also, a parity value of "0," which is stored in memory cell 203-25, is determined by performing XOR operations on data values (e.g., bit values "0," "0," and "0") stored in memory cells 203-5, 203-10, and 203-15, respectively.

In a number of embodiments, an initial parity value corresponding to data stored in memory cells of a particular sense line can be updated responsive to data being written to one or more of the memory cells storing data values protected by the initial parity value. For example, the parity value (e.g., "0") stored in memory cell 203-21 can be updated responsive to data being written to memory cell 203-6, which currently stores a bit value of "1" in this example. The data value stored in memory cell 203-6 can be removed from the initial parity value determination by performing an XOR operation on the data value (e.g., "1") stored in memory cell 203-6 (e.g., the memory cell to be written)) and the corresponding initial parity value (e.g., "0") stored in memory cell 203-21, which results in an updated parity value of "1," in this example (e.g., "1" XOR "0" is "1"). The updated parity value (e.g., "1") can be stored in (e.g., written to) an additional memory cell coupled to the corresponding sense line 205-1 (e.g., memory cell 203-16 or an additional memory cell (not pictured)). In this example, assume the updated (e.g., new) data value being written to memory cell 203-6 is a "0" (e.g., the "1" currently stored in cell 203-6 is to be replaced with a "0"). In response to the writing of a new data value to cell 203-6, an XOR operation is performed on the new data value (e.g., "0") and the updated parity value (e.g., "1"), resulting in a newly updated parity value of "1." Therefore, in this example, a changing (e.g., switching) of the data value stored in a protected memory cell from a bit value of "1" to a bit value of "0" results in a change of the parity value corresponding to the protected data from a "0" to a "1."

Data may be written to a memory cell of an array after a compute transaction has been performed. A compute transaction can include a number of operations and/or calculations that may change data stored in memory cells of the array. Intermediate results of the operations and/or calculations during a compute transaction can be temporarily stored in memory cells of the array (e.g., stored in memory cells of temporary register rows of the array). Writes to be written to memory cells due to operations and/or calculations performed during the compute transaction can be withheld until the end of the compute transaction, preserving data stored in the memory cells prior to the compute transaction in addition to a parity determination for each protected row prior to the compute transaction. As the stored intermediate results are written to a memory cell of the array, a parity value corresponding to the memory cell can be updated.

In a number of embodiments, a parity value determined in accordance with embodiments described herein can be used to recover a correct data value for a memory cell storing an erroneous data value (e.g., an erroneous bit value). The recovered data value can be determined by performing a number of XOR operations. For example, when a memory cell is determined to be storing an erroneous data value (e.g., if memory cell 203-6 should be storing a bit value of "1" but is determined to store a "0"), a number of XOR operations can be performed on the data values stored in the other memory cells (e.g., memory cells 203-1 and 203-11) coupled to the same sense line (e.g., 205-1) as the memory cell storing the erroneous data value and the parity value (e.g., parity value "0" stored in memory cell 203-21) protecting those data values.

In this example, responsive to a determination that cell 203-6 stores an erroneous data value, a first XOR operation is performed on data values stored in memory cells 203-1 and 203-11 (e.g., bit values "1" and "0," respectively). A second XOR operation can be performed on the resultant value (e.g., "1") of the first XOR operation (e.g., "1" XOR "0" is "1") and the parity value (e.g., "0") coupled to the same sense line (e.g., 205-1). The resultant value of the second XOR operation is a bit value "1," which can be stored in the memory cell determined to be storing an erroneous data value (e.g., memory cell 203-6).

Figure 3A:
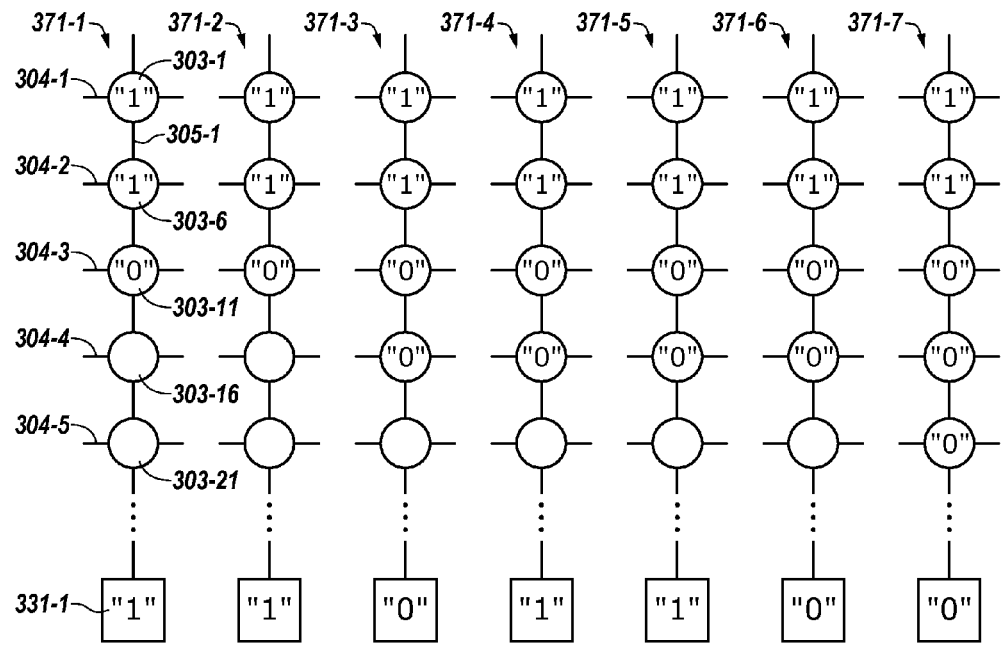
FIGS. 3A and 3B illustrate schematic diagrams associated with a method for performing operations to determine a parity value using sensing circuitry in accordance with a number of embodiments of the present disclosure.
Figure 4:
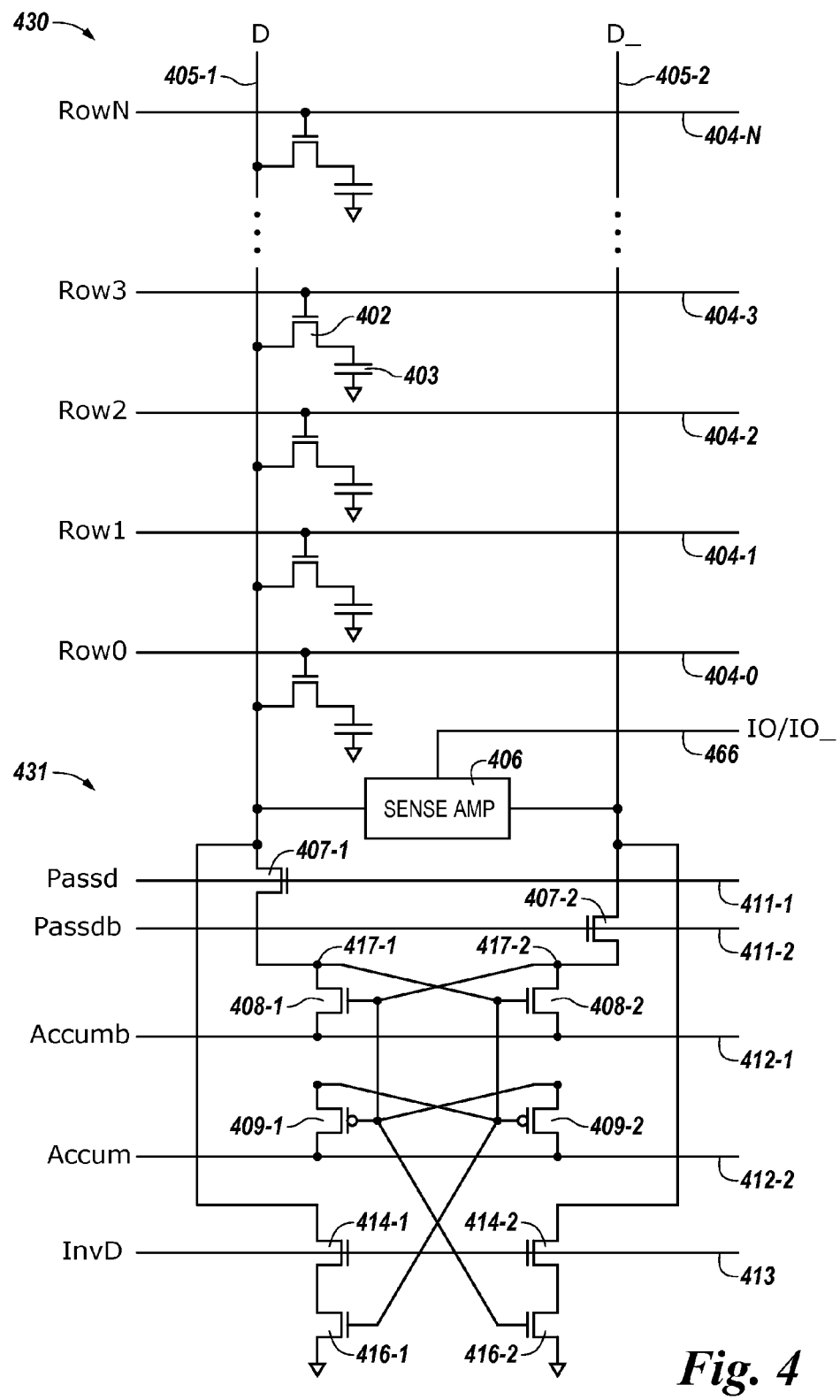
FIG. 4 illustrates a schematic diagram of a portion of a memory array coupled to sensing circuitry in accordance with a number of embodiments of the present disclosure.

FIG. 3A illustrates a schematic diagram associated with a method for parity calculation using sensing circuitry in accordance with a number of embodiments of the present disclosure. FIG. 3A illustrates the particular data value stored in a compute component 331-1 coupled to a particular sense line 305-1 during a number of operation phases 371-1 to 371-7 associated with determining a parity value in accordance with a number of embodiments described herein. The sense line 305-1 can be one of a number of sense lines of an array such as array 201 shown in FIG. 2. As such, the sense line 305-1 includes a number of memory cells 303-1, 303-6, 303-11, 303-16, and 303-21 coupled thereto, and the cells are also coupled to respective access lines 304-1 to 304-5. Compute component 331-1 can be a compute component such as compute component 431 described further below in association with FIG. 4. As such, the compute component 331-1 can comprise devices (e.g., transistors) formed on pitch with the memory cells 303 and/or with corresponding sensing circuitry (e.g., a sense amplifier 206-1 as shown in FIG. 2, sense amplifier 406 shown in FIG. 4 among other sensing circuitry not shown in FIG. 3A).

In this example, the cells coupled to access lines 304-1 to 304-3 (e.g., cells 303-1, 303-6, and 303-11) store data values (e.g., "1," "1," and "0," respectively) to be protected by a parity value stored in the cell coupled to access line 304-5 (e.g., cell 303-21). That is, the access lines 304-1 to 304-3 are protected access lines. Therefore, in this example, the access lines 304-4 and 304-5 are unprotected access lines (e.g., access lines not having protected cells coupled thereto). In this example, the access line 304-5 is the parity access line. The array in FIG. 3A can be a DRAM array, for example, and although not shown, the sense line 305-1 can comprise a respective complementary sense line pair (e.g., complementary sense lines 405-1/405-2 shown in FIG. 4).

Sensing circuitry coupled to the sense line 305-1 can be operated to determine a parity value corresponding to data stored in the protected memory cells (e.g., cells 303-1, 303-6, and 303-11) by performing XOR operations in accordance with a number of embodiments described herein. The XOR operations can be performed by operating the sensing circuitry to perform a number of logical operations such as NAND, AND, OR, and/or invert operations, for instance. The example shown in FIG. 3A illustrates a parity calculation for data stored in memory cells 303-1, 303-6, and 303-11 (e.g., the protected cells coupled to sense line 305-1). Operation phases 371-1 to 371-3 are associated with performing a NAND operation. Operation phases 371-4 to 371-5 are associated with performing an OR operation. Operation phase 371-6 is associated with performing an AND operation on the resultant value of the NAND operation and the OR operation (e.g., "ANDing" the respective NAND and OR resultant values).

Operation phases 371-1 and 371-2 are associated with performing an AND operation on the data value stored in a first memory cell (e.g., 303-1) storing data to be protected by a parity value and the data value stored in a second memory cell (e.g., 303-6) storing data to be protected by the parity value. For example, operation phase 371-1 includes loading the data value (e.g., "1") stored in cell 303-1 to the sensing circuitry (e.g., compute component 331-1) corresponding to sense line 305-1. Loading the data value (e.g., "1") stored in memory cell 303-1 into the compute component 331-1 can include sensing the memory cell 303-1 via a corresponding sense amplifier (e.g., sense amplifier 206-1 shown in FIG. 2) and transferring (e.g., copying) the sensed data value to compute component 331-1 via operation of a number of control signals (as described further below in association with FIGS. 4-6). As such, as shown in FIG. 3A, operation phase 371-1 results in compute component 331-1 storing the data value stored in cell 303-1 (e.g., "1.").

At operation phase 371-2, the sensing circuitry is operated such that the data value stored in compute component 331-1 is the result of ANDing the data value stored in cell 303-1 (e.g., "1") and the data value stored in cell 303-6 (e.g., "1"). As described further below, operating the sensing circuitry to perform an AND operation can include the compute component 331-1 effectively serving as a zeroes (0s) accumulator. As such, in this example, operation phase 371-2 results in a "1" being stored in compute component 331-1 since the data value stored in cell 303-1 (e.g., "1") ANDed with the data value stored in cell 303-6 (e.g., "1") results in a "1."

Operation phase 371-3 includes operating the sensing circuitry to invert the data value stored in the compute component 331-1 (e.g., such that the compute component 331-1 stores the result of NANDing the data values stored in cells 303-1 and 303-6). Since the compute component 331-1 stores the result of ANDing the data value stored in cell 303-1 and the data value stored in cell 303-6 after operation phase 371-2, inverting the data value stored in compute component 331-1 during operation phase 371-3 results in the compute component 331-1 storing the result of NANDing the data values stored in cells 303-1 and 303-6. As such, in this example, inverting the data value stored in compute component 331-1 results in a "0" (e.g., the result of NANDing the "1" stored in cell 303-1 with the "1" stored in cell 303-6 is a "0") being stored in compute component 331-1 (e.g., the stored "1" is inverted to a "0"). An example of performing an invert operation (e.g., inverting a "1" to a "0" or vice versa) on data stored in a compute component is described further below. The sensing circuitry can be operated to store the result of the NAND operation to memory cell 303-16 (e.g., by copying the data value stored in compute component 331-1 thereto) as shown in FIG. 3A.

Operation phases 371-4 and 371-5 are associated with performing an OR operation on the data value stored in the first memory cell (e.g., 303-1) storing data to be protected by a parity value and the data value stored in the second memory cell (e.g., 303-6) storing data to be protected by the parity value. For example, operation phase 371-4 includes loading the data value (e.g., "1") stored in cell 303-1 to the compute component 331-1. Loading the data value (e.g., "1") stored in memory cell 303-1 into the compute component 331-1 can include sensing the memory cell 303-1 via a corresponding sense amplifier (e.g., sense amplifier 206-1 shown in FIG. 2) and transferring (e.g., copying) the sensed data value to compute component 331-1 via operation of a number of control signals (as described further below in association with FIGS. 4-6). As such, as shown in FIG. 3A, operation phase 371-4 results in compute component 331-1 storing the data value stored in cell 303-1 (e.g., "1.").

At operation phase 371-5, the sensing circuitry is operated such that the data value stored in compute component 331-1 is the result of ORing the data value stored in cell 303-1 (e.g., "1") and the data value stored in cell 303-6 (e.g., "1"). As described further below, operating the sensing circuitry to perform an OR operation can include the compute component 331 effectively serving as a ones (1s) accumulator. As such, in this example, operation phase 371-5 results in a "1" being stored in compute component 331-1 since the data value stored in cell 303-1 (e.g., "1") ORed with the data value stored in cell 303-6 (e.g., "1") results in a "1."

Operation phase 371-6 essentially combines the results of the NAND operation and the OR operation performed on the data values stored in cells 303-1 and 303-6 by operating the sensing circuitry to perform an AND operation on the resultant value from the NAND operation (e.g., "0") and the resultant value from the OR operation (e.g., "1"). The resultant value of ANDing the result of a NAND operation with the result of an OR operation is equivalent to the resultant value of an XOR operation performed on the corresponding resultant values. As shown in FIG. 3A, at operation phase 371-6, the resultant value (e.g., "0") from the NAND operation previously performed on the data values stored in protected cells 303-1 and 303-6 is stored in non-protected cell 303-16. Also, at operation phase 371-6, the compute component 331-1 stores the resultant value (e.g., "0") from the OR operation previously performed on the data values stored in cells 303-1 and 303-6. As such, operating the sensing circuitry coupled to sense line 305-1 to AND the data value stored in cell 303-16 and the data value stored in the compute component 331-1 results in the compute component 331-1 storing a "0" (e.g., "0" AND "0" is "0"), which corresponds to the resultant value of performing an XOR operation on the data values stored in the protected cells 303-1 and 303-6 (e.g., "1" XOR "1" is "0"). The resultant value of the XOR operation (e.g., "0," in this instance) is a parity value corresponding to the protected cells. At operation phase 371-7, the sensing circuitry is operated to store the data value (e.g., parity value "0") stored in the compute component 331-1 in parity cell 303-21 (e.g., data value "0" stored in compute component 331-1 is copied to cell 303-21, as shown).

The resulting data value from a first XOR operation (e.g., the "0" resulting from the XOR performed on the data values stored in protected cells 303-1 and 303-6 as described above), can be used in subsequent XOR operations performed on data values stored in other protected memory cells (e.g., memory cell 303-11) coupled to a particular sense line (e.g., sense line 305-1). For example, the sensing circuitry coupled to sense line 305-1 can be operated to perform a second (e.g., subsequent) XOR operation on the resultant value of the first XOR operation (e.g., the "0" resulting from the XOR operation performed on the data values stored in memory cells 303-1 and 303-6) and the data value stored in another memory cell (e.g., the data value "0" stored in cell 303-11 as shown in FIG. 3A). In this example, the second XOR operation would result in a parity value of "0" being stored in parity cell 303-21 at operation phase 371-7 since "0" XOR "0" is "0." As such, the parity value protecting the data stored in cells 303-1, 303-6, and 303-11 is "0," which indicates that the protected data includes an even number of "1s" (e.g., in this instance, the data values "1," "1," and "0" stored in respective cells 303-1, 303-6, and 303-11 comprise two "1s," which is an even number of "1s"). If the sense line 305-1 comprised additional protected cells coupled thereto, then the corresponding sensing circuitry could be operated to perform a respective number of additional XOR operations, in a similar manner as described above, in order to determine a parity value corresponding to the protected data.

While in this example a NAND operation is performed on two data values (e.g., "1" and "1") prior to an OR operation and a result of the NAND operation (e.g., "0") is stored in an additional memory cell (e.g., memory cell 303-16) and a result of the OR ("1) operation is stored in an compute component during an AND operation, embodiments are not so limited. In some embodiments, an OR operation can be performed prior to a NAND operation. In these embodiments, a result of the OR operation can be stored in the additional memory cell and a result of the NAND operation can be stored in the compute component when an AND operation is performed.

Figure 3B:
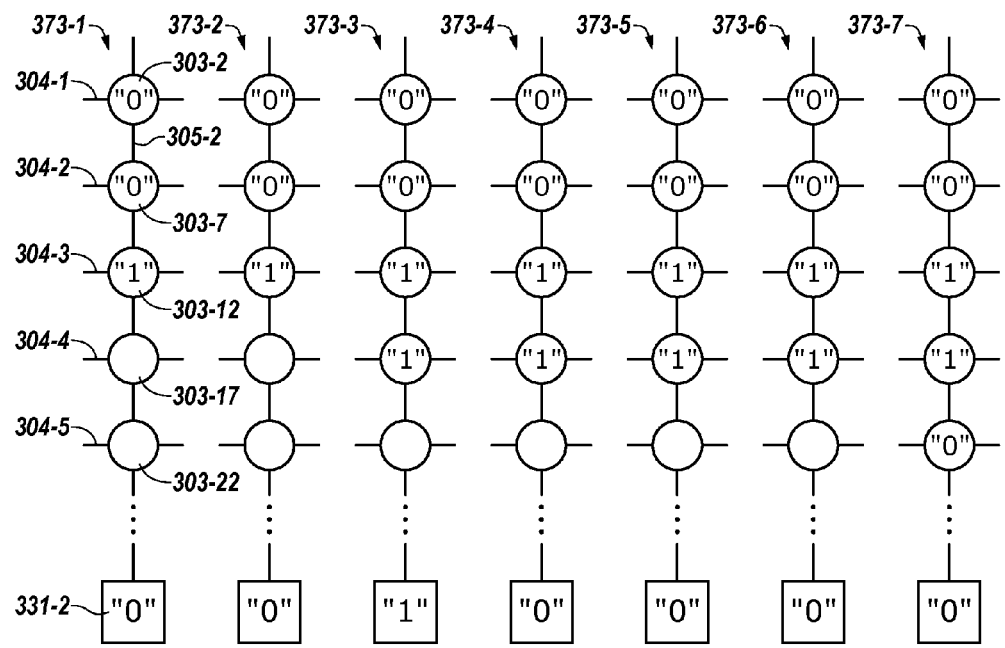

FIG. 3B illustrates a schematic diagram associated with a method for parity calculation using sensing circuitry in accordance with a number of embodiments of the present disclosure. FIG. 3B illustrates the particular data value stored in an compute component 331-2 coupled to a particular sense line 305-2 during a number of operation phases 373-1 to 373-7 associated with determining a parity value in accordance with a number of embodiments described herein. The sense line 305-2 can be one of a number of sense lines of an array such as array 201 shown in FIG. 2. As such, the sense line 305-2 includes a number of memory cells 303-2, 303-7, 303-12, 303-17, and 303-22 coupled thereto, and the cells are also coupled to respective access lines 304-1 to 304-5. Compute component 331-2 can be a compute component such as compute component 431 described further below in association with FIG. 4. As such, the compute component 331-2 can comprise devices (e.g., transistors) formed on pitch with the memory cells 303 and/or with corresponding sensing circuitry (e.g., a sense amplifier 206-2 as shown in FIG. 2, sense amplifier 406 shown in FIG. 4 among other sensing circuitry not shown in FIG. 3B).

In this example, the cells coupled to access lines 304-1 to 304-3 (e.g., cells 303-2, 303-7, and 303-12) store data values (e.g., "0," "0," and "1," respectively) to be protected by a parity value stored in the cell coupled to access line 304-5 (e.g., cell 303-22). That is, the access lines 304-1 to 304-3 are protected access lines. Therefore, in this example, the access lines 304-4 and 304-5 are unprotected access lines (e.g., access lines not having protected cells coupled thereto). In this example, the access line 304-5 is the parity access line. The array In FIG. 3B can be a DRAM array, for example, and although not shown, the sense line 305-1 can comprise a respective complementary sense line pair (e.g., complementary sense lines 405-1/405-2 shown in FIG. 4).

Sensing circuitry coupled to the sense line 305-2 can be operated to determine a parity value corresponding to data stored in the protected memory cells (e.g., cells 303-2, 303-7, and 303-12) by performing XOR operations in accordance with a number of embodiments described herein. The XOR operations can be performed by operating the sensing circuitry to perform a number of logical operations such as NAND, AND, OR, and/or invert operations, for instance. The example shown in FIG. 3B illustrates a parity calculation for data stored in memory cells 303-2, 303-7, and 303-12 (e.g., the protected cells coupled to sense line 305-1). Operation phases 373-1 to 373-3 are associated with performing a NAND operation. Operation phases 373-4 to 373-5 are associated with performing an OR operation. Operation phase 373-6 is associated with performing an AND operation on the resultant value of the NAND operation and the OR operation (e.g., "ANDing" the respective NAND and OR resultant values).

Operation phases 373-1 and 373-2 are associated with performing an AND operation on the data value stored in a first memory cell (e.g., 303-2) storing data to be protected by a parity value and the data value stored in a second memory cell (e.g., 303-7) storing data to be protected by the parity value. For example, operation phase 373-1 includes loading the data value (e.g., "0") stored in cell 303-2 to the sensing circuitry (e.g., compute component 331-2) corresponding to sense line 305-2. Loading the data value (e.g., "0") stored in memory cell 303-2 into the compute component 331-2 can include sensing the memory cell 303-2 via a corresponding sense amplifier (e.g., sense amplifier 206-2 shown in FIG. 2) and transferring (e.g., copying) the sensed data value to compute component 331-2 via operation of a number of control signals (as described further below in association with FIGS. 4-6). As such, as shown in FIG. 3B, operation phase 373-1 results in compute component 331-2 storing the data value stored in cell 303-2 (e.g., "0.").

At operation phase 373-2, the sensing circuitry is operated such that the data value stored in compute component 331-2 is the result of ANDing the data value stored in cell 303-2 (e.g., "0") and the data value stored in cell 303-7 (e.g., "0"). As described further below, operating the sensing circuitry to perform an AND operation can include the compute component 331-2 effectively serving as a zeroes (0s) accumulator. As such, in this example, operation phase 373-2 results in a "0" being stored in compute component 331-2 since the data value stored in cell 303-2 (e.g., "0") ANDed with the data value stored in cell 303-7 (e.g., "0") results in a "0."

Operation phase 373-3 includes operating the sensing circuitry to invert the data value stored in the compute component 331-2 (e.g., such that the compute component 331-2 stores the result of NANDing the data values stored in cells 303-2 and 303-7). Since the compute component 331-2 stores the result of ANDing the data value stored in cell 303-2 and the data value stored in cell 303-7 after operation phase 373-2, inverting the data value stored in compute component 331-2 during operation phase 373-3 results in the compute component 331-2 storing the result of NANDing the data values stored in cells 303-2 and 303-7. As such, in this example, inverting the data value stored in compute component 331-2 results in a "1" (e.g., the result of NANDing the "0" stored in cell 303-2 with the "0" stored in cell 303-7 is a "1") being stored in compute component 331-2 (e.g., the stored "0" is inverted to a "1"). An example of performing an invert operation (e.g., inverting a "0" to a "1" or vice versa) on data stored in a compute component is described further below. The sensing circuitry can be operated to store the result of the NAND operation to memory cell 303-17 (e.g., by copying the data value stored in compute component 331-2 thereto) as shown in FIG. 3B.

Operation phases 373-4 and 373-5 are associated with performing an OR operation on the data value stored in the first memory cell (e.g., 303-2) storing data to be protected by a parity value and the data value stored in the second memory cell (e.g., 303-7) storing data to be protected by the parity value. For example, operation phase 373-4 includes loading the data value (e.g., "0") stored in cell 303-2 to the compute component 331-2. Loading the data value (e.g., "0") stored in memory cell 303-2 into the compute component 331-2 can include sensing the memory cell 303-2 via a corresponding sense amplifier (e.g., sense amplifier 206-2 shown in FIG. 2) and transferring (e.g., copying) the sensed data value to compute component 331-2 via operation of a number of control signals (as described further below in association with FIGS. 4-6). As such, as shown in FIG. 3B, operation phase 373-4 results in compute component 331-2 storing the data value stored in cell 303-2 (e.g., "0").

At operation phase 373-5, the sensing circuitry is operated such that the data value stored in compute component 331-2 is the result of ORing the data value stored in cell 303-2 (e.g., "0") and the data value stored in cell 303-7 (e.g., "0"). As described further below, operating the sensing circuitry to perform an OR operation can include the compute component 331-2 effectively serving as a ones (1s) accumulator. As such, in this example, operation phase 373-5 results in a "0" being stored in compute component 331-2 since the data value stored in cell 303-2 (e.g., "0") ORed with the data value stored in cell 303-7 (e.g., "0") results in a "0."

Operation phase 373-6 essentially combines the results of the NAND operation and the OR operation performed on the data values stored in cells 303-2 and 303-7 by operating the sensing circuitry to perform an AND operation on the resultant value from the NAND operation (e.g., "1") and the resultant value from the OR operation (e.g., "0"). The resultant value of ANDing the result of a NAND operation with the result of an OR operation is equivalent to the resultant value of an XOR operation performed on the corresponding resultant values. As shown in FIG. 3B, at operation phase 373-6, the resultant value (e.g., "1") from the NAND operation previously performed on the data values stored in protected cells 303-2 and 303-7 is stored in non-protected cell 303-17. Also, at operation phase 373-6, the compute component 331-2 stores the resultant value (e.g., "0") from the OR operation previously performed on the data values stored in cells 303-2 and 303-7. As such, operating the sensing circuitry coupled to sense line 305-2 to AND the data value stored in cell 303-17 and the data value stored in the compute component 331-2 results in the compute component 331-2 storing a "0" (e.g., "1" AND "0" is "0"), which corresponds to the resultant value of performing an XOR operation on the data values stored in the protected cells 303-2 and 303-7 (e.g., "0" XOR "0" is "0"). The resultant value of the XOR operation (e.g., "0," in this instance) is a parity value corresponding to the protected cells. At operation phase 373-7, the sensing circuitry is operated to store the data value (e.g., parity value "0") stored in the compute component 331-2 in parity cell 303-22 (e.g., data value "0" stored in compute component 331-2 is copied to cell 303-22, as shown).

The resulting data value from a first XOR operation (e.g., the "0" resulting from the XOR performed on the data values stored in protected cells 303-2 and 303-7 as described above), can be used in subsequent XOR operations performed on data values stored in other protected memory cells (e.g., memory cell 303-12) coupled to a particular sense line (e.g., sense line 305-2). For example, the sensing circuitry coupled to sense line 305-2 can be operated to perform a second (e.g., subsequent) XOR operation on the resultant value of the first XOR operation (e.g., the "0" resulting from the XOR operation performed on the data values stored in memory cells 303-2 and 303-7) and the data value stored in another memory cell (e.g., the data value "1" stored in cell 303-12 as shown in FIG. 3B). In this example, the second XOR operation would result in a parity value of "1" being stored in parity cell 303-22 at operation phase 373-7 since "0" XOR "1" is "1." As such, the parity value protecting the data stored in cells 303-2, 303-7, and 303-12 is "1," which indicates that the protected data includes an odd number of "1s" (e.g., in this instance, the data values "0," "0," and "1" stored in respective cells 303-2, 303-7, and 303-12 comprise one "1," which is an odd number of "1s"). If the sense line 305-2 comprised additional protected cells coupled thereto, then the corresponding sensing circuitry could be operated to perform a respective number of additional XOR operations, in a similar manner as described above, in order to determine a parity value corresponding to the protected data.

FIG. 4 illustrates a schematic diagram of a portion of a memory array 430 coupled to sensing circuitry in accordance with a number of embodiments of the present disclosure. In this example, the memory array 430 is a DRAM array of 1T1C (one transistor one capacitor) memory cells each comprising an access device 402 (e.g., transistor) and a storage element 403 (e.g., a capacitor). Embodiments, however, are not limited to this example and other array types are possible (e.g., cross point arrays having PCRAM memory elements, etc.). The cells of array 430 are arranged in rows coupled by access lines 404-0 (Row0), 404-1 (Row1), 404-2, (Row2) 404-3 (Row3), . . . , 404-N(RowN) and columns coupled by sense lines (e.g., digit lines) 305-1 (D) and 405-2 (D_). In this example, each column of cells is associated with a pair of complementary sense lines 405-1 (D) and 405-2 (D_).

In a number of embodiments, a compute component (e.g., 431) can comprise a number of transistors formed on pitch with the transistors of a sense amp (e.g., 406) and/or the memory cells of the array (e.g., 430), which may conform to a particular feature size (e.g., $4F^2$, $6F^2$, etc.). As described further below, the compute component 431 can, in conjunction with the sense amp 406, operate to perform various operations associated with calculating a parity value without transferring data via a sense line address access (e.g., without firing a column decode signal such that data is transferred to circuitry external from the array and sensing circuitry via local I/O lines (e.g., I/O line 466 and/or I/O line 234 shown in FIG. 2)).

In the example illustrated in FIG. 4, the circuitry corresponding to compute component 431 comprises five transistors coupled to each of the sense lines D and D_; however, embodiments are not limited to this example. Transistors 407-1 and 407-2 have a first source/drain region coupled to sense lines D and D_, respectively, and a second source/drain region coupled to a cross coupled latch (e.g., coupled to gates of a pair of cross coupled transistors, such as cross coupled NMOS transistors 408-1 and 408-2 and cross coupled PMOS transistors 409-1 and 409-2). As described further herein, the cross coupled latch comprising transistors 408-1, 408-2, 409-1, and 409-2 can be referred to as a secondary latch, which can serve as and be referred to herein as an accumulator (a cross coupled latch corresponding to sense amp 406 can be referred to herein as a primary latch).

The transistors 407-1 and 407-2 can be referred to as pass transistors, which can be enabled via respective signals 411-1 (Passd) and 411-2 (Passdb) in order to pass the voltages or currents on the respective sense lines D and D_ to the inputs of the cross coupled latch comprising transistors 408-1, 408-2, 409-1, and 409-2 (e.g., the input of the secondary latch). In this example, the second source/drain region of transistor 407-1 is coupled to a first source/drain region of transistors 408-1 and 409-1 as well as to the gates of transistors 408-2 and 409-2. Similarly, the second source/drain region of transistor 407-2 is coupled to a first source/drain region of transistors 408-2 and 409-2 as well as to the gates of transistors 408-1 and 409-1.

A second source/drain region of transistor 408-1 and 408-2 is commonly coupled to a negative control signal 412-1 (Accumb). A second source/drain region of transistors 409-1 and 409-2 is commonly coupled to a positive control signal 412-2 (Accum). An activated Accum signal 412-2 can be a supply voltage (e.g., Vcc) and an activated Accumb signal can be a reference voltage (e.g., ground). Activating signals 412-1 and 412-2 enables the cross coupled latch comprising transistors 408-1, 408-2, 409-1, and 409-2 corresponding to the secondary latch. The enabled cross coupled latch operates to amplify a differential voltage between common node 417-1 and common node 417-2 such that node 417-1 is driven to one of the Accum signal voltage and the Accumb signal voltage (e.g., to one of Vcc and ground), and node 417-2 is driven to the other of the Accum signal voltage and the Accumb signal voltage. As described further below, the signals 412-1 and 412-2 are labeled "Accum" and "Accumb" because the secondary latch can serve as an accumulator while being used to perform a logical operation (e.g., an AND operation). In a number of embodiments, an accumulator comprises the cross coupled transistors 408-1, 408-2, 409-1, and 409-2 forming the secondary latch as well as the pass transistors 407-1 and 408-2.

In this example, the compute component 431 also includes inverting transistors 414-1 and 414-2 having a first source/drain region coupled to the respective digit lines D and D_. A second source/drain region of the transistors 414-1 and 414-2 is coupled to a first source/drain region of transistors 416-1 and 416-2, respectively. The second source/drain region of transistors 416-1 and 416-2 can be coupled to a ground. The gates of transistors 414-1 and 314-2 are coupled to a signal 413 (InvD). The gate of transistor 416-1 is coupled to the common node 417-1 to which the gate of transistor 408-2, the gate of transistor 409-2, and the first source/drain region of transistor 408-1 are also coupled. In a complementary fashion, the gate of transistor 416-2 is coupled to the common node 417-2 to which the gate of transistor 408-1, the gate of transistor 409-1, and the first source/drain region of transistor 408-2 are also coupled. As such, an invert operation can be performed by activating signal InvD, which inverts the data value stored in the secondary latch (e.g., the data value stored in the compute component) and drives the inverted value onto sense lines 405-1 and 405-2.

In a number of embodiments, and as indicated above in association with FIGS. 2 and 3, the compute component can be used to perform, for instance, NAND, AND, OR, and invert operations in association with calculating a parity value. For example, a data value stored in a particular cell can be sensed by a corresponding sense amp 406. The data value can be transferred to the data latch of the compute component 431 by activating the Passd (411-1) and Passdb (411-2) signals as well as the Accumb (412-1) and Accum signals (412-2). To AND the data value stored in the compute component with a data value stored in a different particular cell coupled to a same sense line, the access line to which the different particular cell is coupled can be enabled. The sense amp 406 can be enabled (e.g., fired), which amplifies the differential signal on sense lines 405-1 and 405-2. Activating only Passd (411-1) (e.g., while maintaining Passdb (411-2) in a deactivated state) results in accumulating the data value corresponding to the voltage signal on sense line 405-1 (e.g., Vcc corresponding to logic "1" or ground corresponding to logic "0"). The Accumb and Accum signals remain activated during the AND operation. Therefore, if the data value stored in the different particular cell (and sensed by sense amp 406) is a logic "0", then value stored in the secondary latch of the compute component is asserted low (e.g., ground voltage such as 0V), such that it stores a logic "0." However, if the value stored in the different particular cell (and sensed by sense amp 406) is not a logic "0," then the secondary latch of the compute component retains its previous value. Therefore, the compute component will only store a logic "1" if it previously stored a logic "1" and the different particular cell also stores a logic "1." Hence, the compute component 431 is operated to perform a logic AND operation. As noted above, the invert signal 413 can be activated in order to invert the data value stored by the compute component 431, which can be used, for example, in performing a NAND operation (e.g., by inverting the result of an AND operation).

Figure 5A:
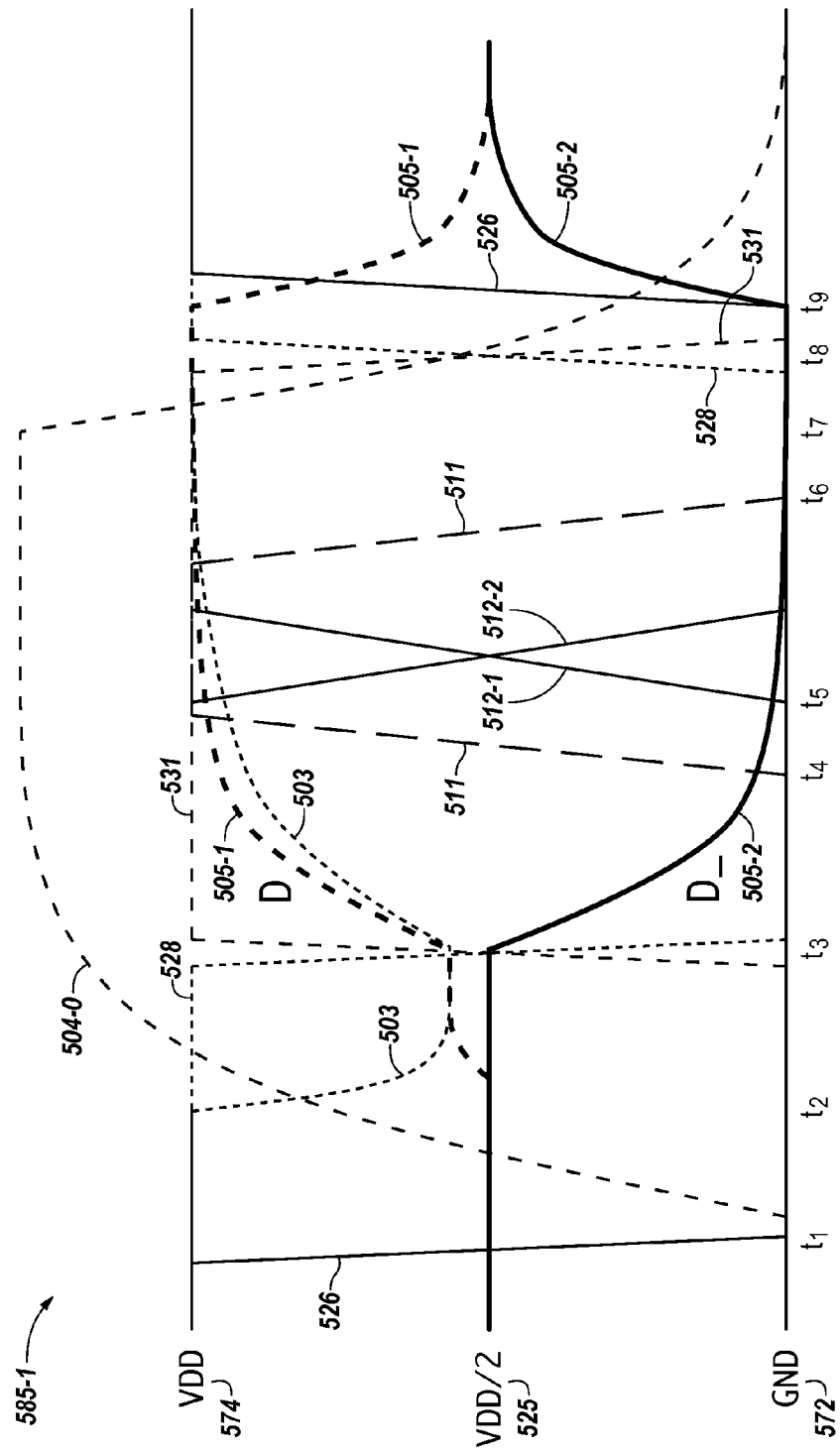
FIG. 5A illustrates a timing diagram associated with performing a number of logical operations using sensing circuitry in accordance with a number of embodiments of the present disclosure.

FIG. 5A illustrates a timing diagram 585-1 associated with performing a number of logical operations using sensing circuitry in accordance with a number of embodiments of the present disclosure. Timing diagram 585-1 illustrates signals (e.g., voltage signals) associated with performing a first operation phase of a logical operation (e.g., an R-input logical operation). The first operation phase described in FIG. 5A can be a first operation phase of an AND, NAND, OR, or NOR operation, for instance. As described further below, performing the operation phase illustrated in FIG. 5A can involve consuming significantly less energy (e.g., about half) than previous processing approaches, which may involve providing a full swing between voltage rails (e.g., between a supply and ground) to perform a logical operation.

In the example illustrated in FIG. 5A, the voltage rails corresponding to complementary logic values (e.g., "1" and "0") are a supply voltage 574 (VDD) and a ground voltage 572 (Gnd). Prior to performing a logical operation, equilibration can occur such that the complementary sense lines D and D_ are shorted together at an equilibration voltage 525 (VDD/2). Equilibration is described further below in association with FIG. 6.

At time $t_1$, the equilibration signal 526 is deactivated, and then a selected access line (e.g., row) is enabled (e.g., the row corresponding to a memory cell whose data value is to be sensed and used as a first input). Signal 504-0 represents the voltage signal applied to the selected row (e.g., row 404-0 in FIG. 4). When row signal 504-0 reaches the threshold voltage (Vt) of the access transistor (e.g., 402) corresponding to the selected cell, the access transistor turns on and couples the sense line D to the selected memory cell (e.g., to the capacitor 403 if the cell is a 1T1C DRAM cell), which creates a differential voltage signal between the sense lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to sense line D) does not consume energy, since the energy associated with activating/deactivating the row signal 504 can be amortized over the plurality of memory cells coupled to the row.

At time $t_3$, the sense amp (e.g., 406) is enabled (e.g., the positive control signal 531 (e.g., PSA 631 shown in FIG. 6) goes high, and the negative control signal 528 (e.g., RNL_ 628) goes low), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of sense amp 406. The primary energy consumption can occur in charging the sense line D (505-1) from the equilibration voltage VDD/2 to the rail voltage VDD.

At time $t_4$, the pass transistors 407-1 and 407-2 are enabled (e.g., via respective Passd and Passdb control signals applied to control lines 411-1 and 411-2, respectively, in FIG. 4). The control signals 411-1 and 411-2 are referred to collectively as control signals 511. As used herein, various control signals, such as Passd and Passdb, may be referenced by referring to the control lines to which the signals are applied. For instance, a Passd signal can be referred to as control signal 411-1. At time $t_5$, the accumulator control signals Accumb and Accum are activated via respective control lines 412-1 and 412-2. As described below, the accumulator control signals (e.g., accumulator control signals 512-1 and 512-2) may remain activated for subsequent operation phases. As such, in this example, activating the control signals 512-1 and 512-2 enables the secondary latch of the compute component (e.g., 431). The sensed data value stored in sense amp 406 is transferred (e.g., copied) to the secondary latch of compute component 431.

At time $t_6$, the pass transistors 407-1 and 407-2 are disabled (e.g., turned off); however, since the accumulator control signals 512-1 and 512-2 remain activated, an accumulated result is stored (e.g., latched) in the secondary latch of compute component 431. At time $t_7$, the row signal 504-0 is deactivated, and the array sense amps are disabled at time $t_8$ (e.g., sense amp control signals 528 and 531 are deactivated).

At time $t_9$, the sense lines D and D_ are equilibrated (e.g., equilibration signal 526 is activated), as illustrated by sense line voltage signals 505-1 and 505-2 moving from their respective rail values to the equilibration voltage 525 (VDD/2). The equilibration consumes little energy due to the law of conservation of energy. As described below in association with FIG. 6, equilibration can involve shorting the complementary sense lines D and D_ together at an equilibration voltage, which is VDD/2, in this example. Equilibration can occur, for instance, prior to a memory cell sensing operation.

Figures 1, 5B:
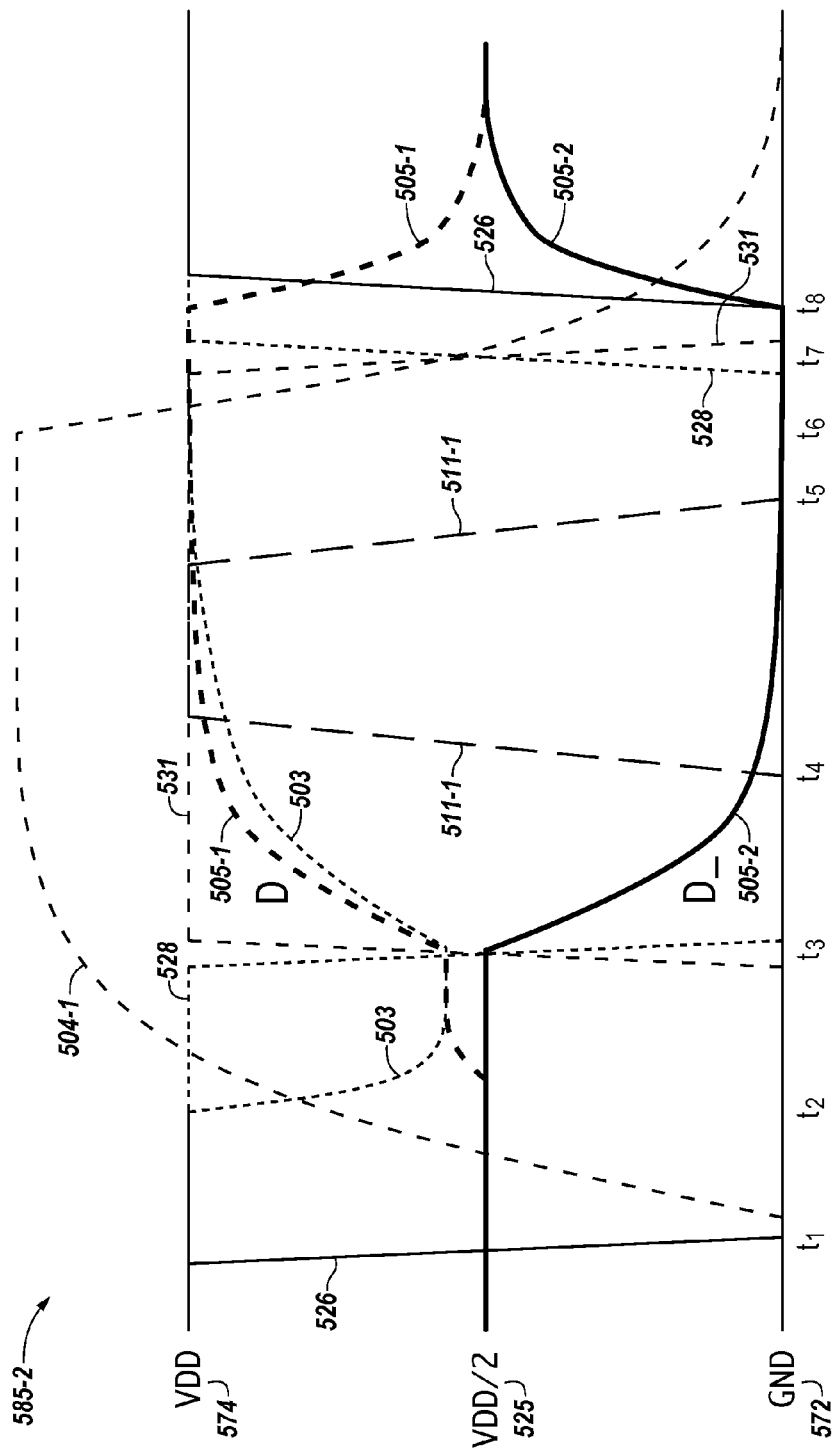
Figures 2, 5B:
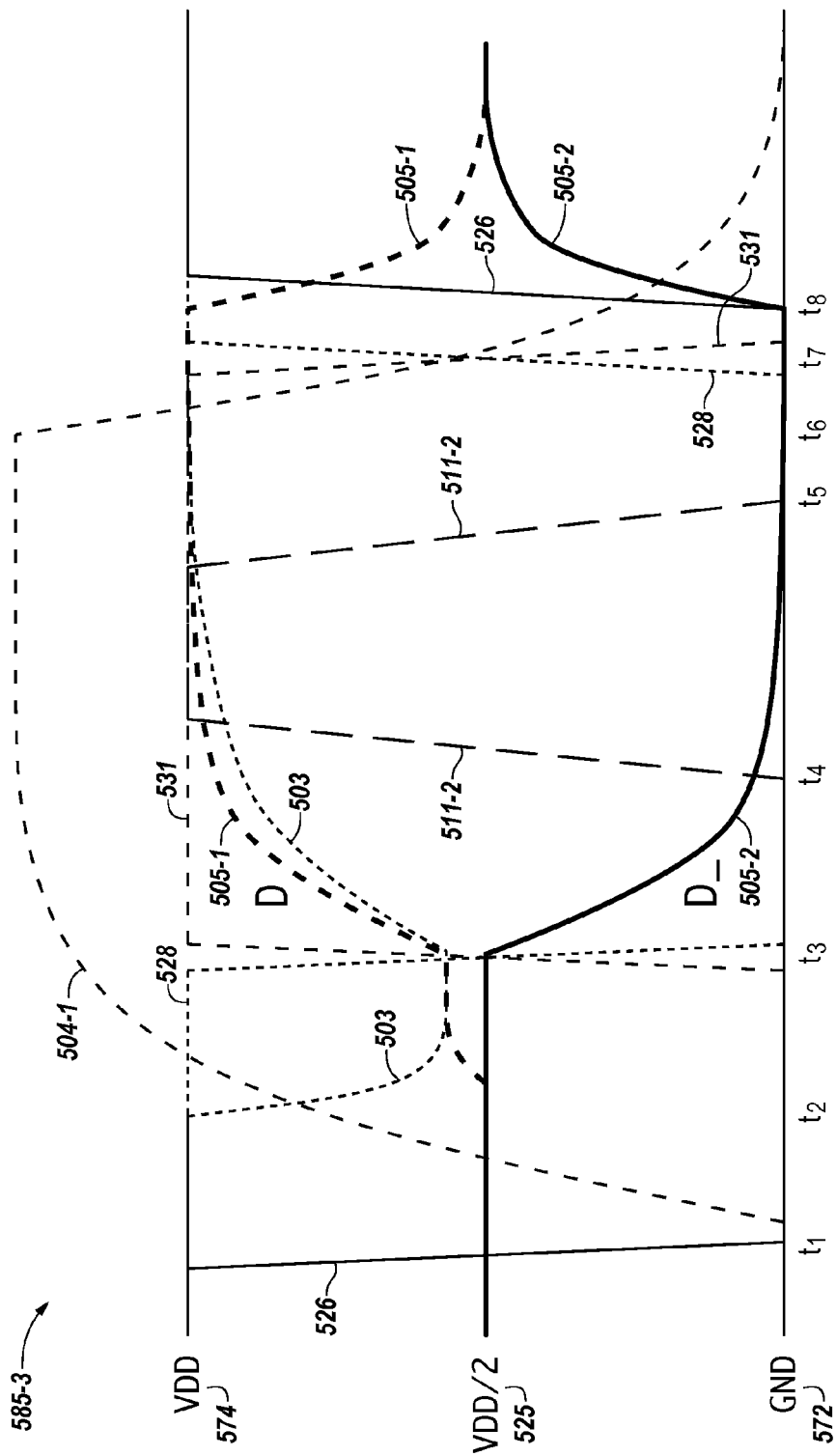

FIGS. 5B-1 and 5B-2 illustrate timing diagrams 585-2 and 585-3, respectively, associated with performing a number of logical operations using sensing circuitry in accordance with a number of embodiments of the present disclosure. Timing diagrams 585-2 and 585-3 illustrate signals (e.g., voltage signals) associated with performing a number of intermediate operation phases of a logical operation (e.g., an R-input logical operation). For instance, timing diagram 585-2 corresponds to a number of intermediate operation phases of an R-input NAND operation or an R-input AND operation, and timing diagram 585-3 corresponds to a number of intermediate operation phases of an R-input NOR operation or an R-input OR operation. For example, performing an AND or NAND operation can include performing the operation phase shown in FIG. 5B-1 one or more times subsequent to an initial operation phase such as that described in FIG. 5A. Similarly, performing an OR or NOR operation can include performing the operation phase shown in FIG. 5B-2 one or more times subsequent to an initial operation phase such as that described in FIG. 5A.

As shown in timing diagrams 585-2 and 585-3, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., row 404-1 in FIG. 4). When row signal 504-1 reaches the threshold voltage (Vt) of the access transistor (e.g., 402) corresponding to the selected cell, the access transistor turns on and couples the sense line D to the selected memory cell (e.g., to the capacitor 403 if the cell is a 1T1C DRAM cell), which creates a differential voltage signal between the sense lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to sense line D) does not consume energy, since the energy associated with activating/deactivating the row signal 504 can be amortized over the plurality of memory cells coupled to the row.

At time $t_3$, the sense amp (e.g., 406) is enabled (e.g., the positive control signal 531 (e.g., PSA 631 shown in FIG. 6) goes high, and the negative control signal 528 (e.g., RNL_628) goes low), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of a sense amp (e.g., sense amp 406). The primary energy consumption occurs in charging the sense line D (405-1) from the equilibration voltage VDD/2 to the rail voltage VDD.

As shown in timing diagrams 585-2 and 585-3, at time $t_4$ (e.g., after the selected cell is sensed), only one of control signals 411-1 (Passd) and 411-2 (Passdb) is activated (e.g., only one of pass transistors 407-1 and 407-2 is enabled), depending on the particular logic operation. For example, since timing diagram 585-2 corresponds to an intermediate phase of a NAND or AND operation, control signal 411-1 is activated at time $t_4$ and control signal 411-2 remains deactivated. Conversely, since timing diagram 585-3 corresponds to an intermediate phase of a NOR or OR operation, control signal 411-2 is activated at time $t_4$ and control signal 411-1 remains deactivated. Recall from above that the accumulator control signals 512-1 (Accumb) and 512-2 (Accum) were activated during the initial operation phase described in FIG. 5A, and they remain activated during the intermediate operation phase(s).

Since the compute component was previously enabled, activating only Passd (411-1) results in accumulating the data value corresponding to the voltage signal 505-1. Similarly, activating only Passdb (411-2) results in accumulating the data value corresponding to the voltage signal 505-2. For instance, in an example AND/NAND operation (e.g., timing diagram 585-2) in which only Passd (411-1) is activated, if the data value stored in the selected memory cell (e.g., a Row1 memory cell in this example) is a logic 0, then the accumulated value associated with the secondary latch is asserted low such that the secondary latch stores logic 0. If the data value stored in the Row1 memory cell is not a logic 0, then the secondary latch retains its stored Row0 data value (e.g., a logic 1 or a logic 0). As such, in this AND/NAND operation example, the secondary latch is serving as a zeroes (0s) accumulator. Similarly, in an example OR/NOR operation (e.g., timing diagram 585-3) in which only Passdb is activated, if the data value stored in the selected memory cell (e.g., a Row1 memory cell in this example) is a logic 1, then the accumulated value associated with the secondary latch is asserted high such that the secondary latch stores logic 1. If the data value stored in the Row1 memory cell is not a logic 1, then the secondary latch retains its stored Row0 data value (e.g., a logic 1 or a logic 0). As such, in this OR/NOR operation example, the secondary latch is effectively serving as a ones (1s) compute component since voltage signal 405-2 on D_ is setting the true data value of the compute component.

Figures 1, 5C:
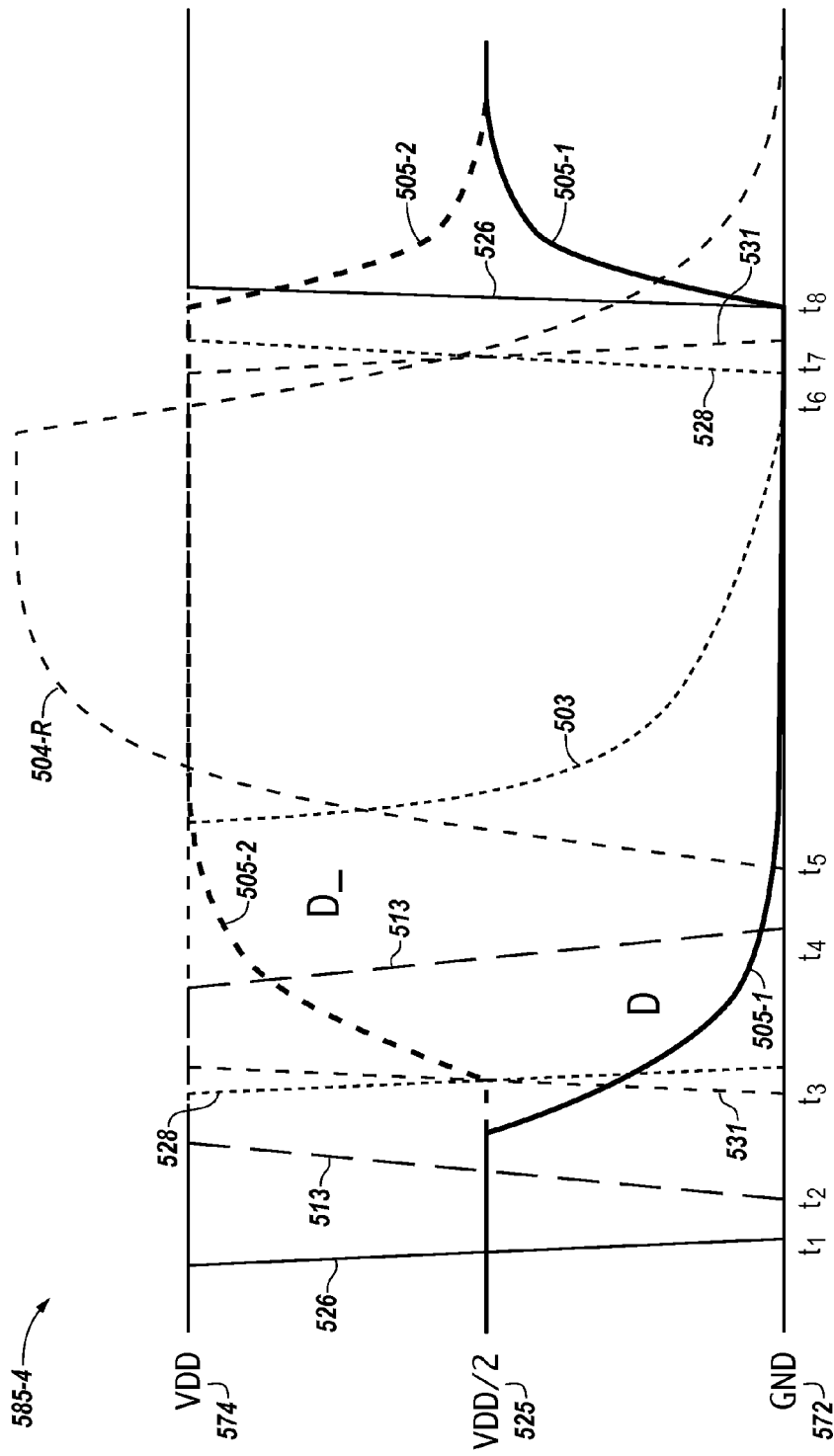
Figures 2, 5C:
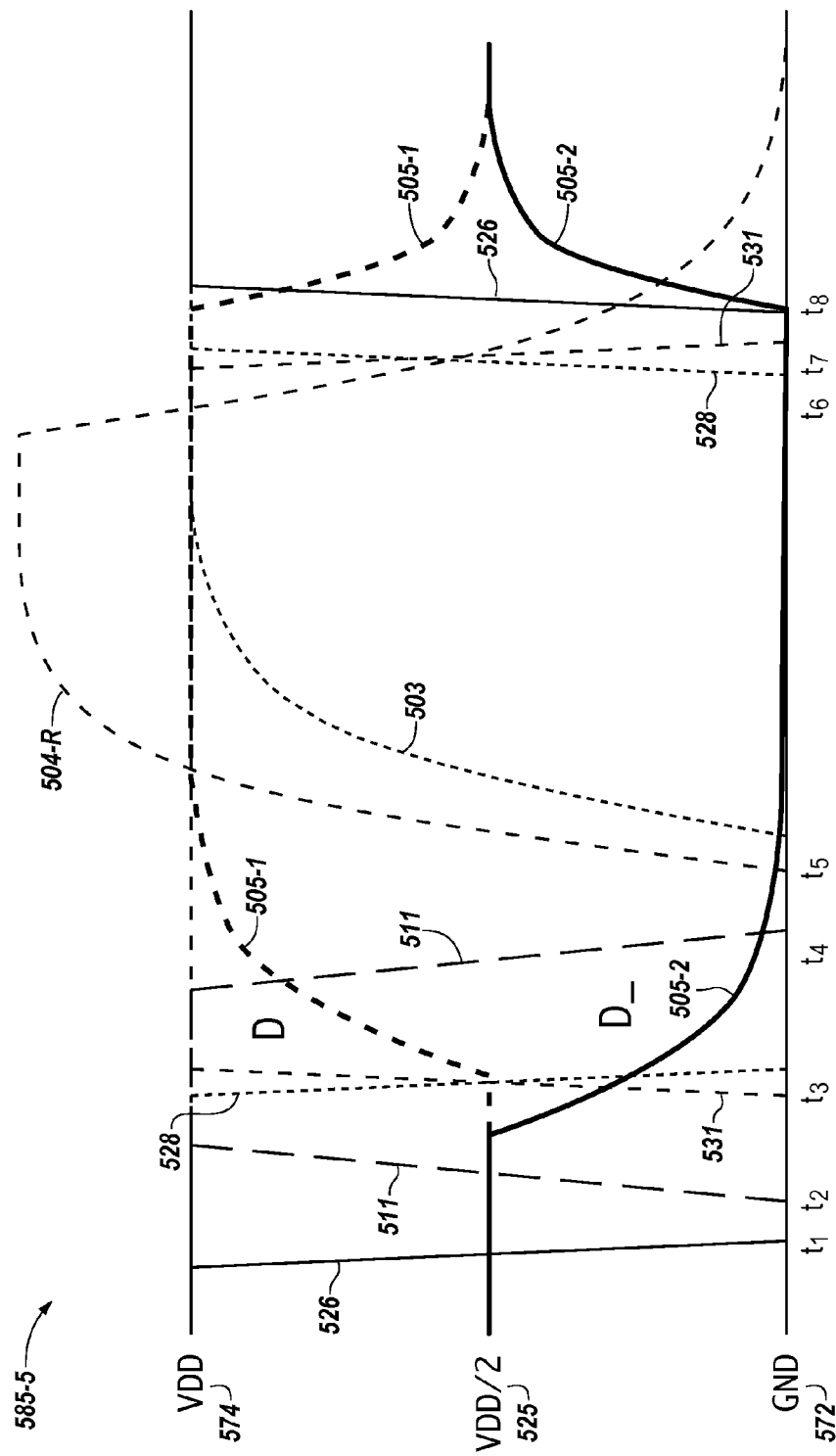

At the conclusion of an intermediate operation phase such as that shown in FIGS. 5B-1 and 5B-2, the Passd signal (e.g., for AND/NAND) or the Passdb signal (e.g., for OR/NOR) is deactivated (e.g., at time t5), the selected row is disabled (e.g., at time t6), the sense amp is disabled (e.g., at time t7), and equilibration occurs (e.g., at time t8). An intermediate operation phase such as that illustrated in FIG. 5B-1 or 5B-2 can be repeated in order to accumulate results from a number of additional rows. As an example, the sequence of timing diagram 585-2 or 585-3 can be performed a subsequent (e.g., second) time for a Row2 memory cell, a subsequent (e.g., third) time for a Row3 memory cell, etc. For instance, for a 10-input NOR operation, the intermediate phase shown in FIG. 5B-2 can occur 9 times to provide 9 inputs of the 10-input logical operation, with the tenth input being determined during the initial operation phase (e.g., as described in FIG. 5A). The above described logical operations (e.g., AND, OR, NAND, NOR) can be performed in association with calculating a parity value in accordance with embodiments of the present disclosure. FIGS. 5C-1 and 5C-2 illustrate timing diagrams 585-4 and 585-5, respectively, associated with performing a number of logical operations using sensing circuitry in accordance with a number of embodiments of the present disclosure. Timing diagrams 585-4 and 585-5 illustrate signals (e.g., voltage signals) associated with performing a last operation phase of a logical operation (e.g., an R-input logical operation). For instance, timing diagram 585-4 corresponds to a last operation phase of an R-input NAND operation or an R-input NOR operation, and timing diagram 585-5 corresponds to a last operation phase of an R-input AND operation or an R-input OR operation. For example, performing a NAND operation can include performing the operation phase shown in FIG. 5C-1 subsequent to a number of iterations of the intermediate operation phase described in association with FIG. 5B-1, performing a NOR operation can include performing the operation phase shown in FIG. 5C-1 subsequent to a number of iterations of the intermediate operation phase described in association with FIG. 5B-2, performing an AND operation can include performing the operation phase shown in FIG. 5C-2 subsequent to a number of iterations of the intermediate operation phase described in association with FIG. 5B-1, and performing an OR operation can include performing the operation phase shown in FIG. 5C-2 subsequent to a number of iterations of the intermediate operation phase described in association with FIG. 5B-2. Table 1 shown below indicates the Figures corresponding to the sequence of operation phases associated with performing a number of R-input logical operations in accordance with a number of embodiments described herein.

TABLE 1

| Operation | FIG. 5A | FIG. 5B-1 | FIG. 5B-2 | FIG. 5C-1 | FIG. 5C-2 |
|---|---|---|---|---|---|
| AND | First phase | R-1 iterations | | | Last phase |
| NAND | First phase | R-1 iterations | | Last phase | |
| OR | First phase | | R-1 iterations | | Last phase |
| NOR | First phase | | R-1 iterations | Last phase | |

The last operation phases of FIGS. 5C-1 and 5C-2 are described in association with storing a result of an R-input logical operation to a row of the array (e.g., array 430). However, in a number of embodiments, the result can be stored to a suitable location other than back to the array (e.g., to an external register associated with a controller and/or host processor, to a memory array of a different memory device, etc., via I/O lines).

As shown in timing diagrams 585-4 and 585-5, at time $t_1$, equilibration is disabled (e.g., the equilibration signal 526 is deactivated) such that sense lines D and D_ are floating. At time t2, either the InvD signal 513 or the Passd and Passdb signals 511 are activated, depending on which logical operation is being performed. In this example, the InvD signal 513 is activated for a NAND or NOR operation (see FIG. 5C-1), and the Passd and Passdb signals 511 are activated for an AND or OR operation (see FIG. 5C-2).

Activating the InvD signal 513 at time t2 (e.g., in association with a NAND or NOR operation) enables transistors 414-1/414-2 and results in an inverting of the data value stored in the secondary latch of the compute component (e.g., 431) as either sense line D or sense line D_ is pulled low. As such, activating signal 513 inverts the accumulated output. Therefore, for a NAND operation, if any of the memory cells sensed in the prior operation phases (e.g., the initial operation phase and one or more intermediate operation phases) stored a logic 0 (e.g., if any of the R-inputs of the NAND operation were a logic 0), then the sense line D_ will carry a voltage corresponding to logic 0 (e.g., a ground voltage) and sense line D will carry a voltage corresponding to logic 1 (e.g., a supply voltage such as VDD). For this NAND example, if all of the memory cells sensed in the prior operation phases stored a logic 1 (e.g., all of the R-inputs of the NAND operation were logic 1), then the sense line D_ will carry a voltage corresponding to logic 1 and sense line D will carry a voltage corresponding to logic 0. At time t3, the primary latch of sense amp 406 is then enabled (e.g., the sense amp is fired), driving D and D_ to the appropriate rails, and the sense line D now carries the NANDed result of the respective input data values as determined from the memory cells sensed during the prior operation phases. As such, sense line D will be at VDD if any of the input data values are a logic 0 and sense line D will be at ground if all of the input data values are a logic 1.

For a NOR operation, if any of the memory cells sensed in the prior operation phases (e.g., the initial operation phase and one or more intermediate operation phases) stored a logic 1 (e.g., if any of the R-inputs of the NOR operation were a logic 1), then the sense line D_ will carry a voltage corresponding to logic 1 (e.g., VDD) and sense line D will carry a voltage corresponding to logic 0 (e.g., ground). For this NOR example, if all of the memory cells sensed in the prior operation phases stored a logic 0 (e.g., all of the R-inputs of the NOR operation were logic 0), then the sense line D_ will carry a voltage corresponding to logic 0 and sense line D will carry a voltage corresponding to logic 1. At time t3, the primary latch of sense amp 406 is then enabled and the sense line D now contains the NORed result of the respective input data values as determined from the memory cells sensed during the prior operation phases. As such, sense line D will be at ground if any of the input data values are a logic 1 and sense line D will be at VDD if all of the input data values are a logic 0.

Referring to FIG. 5C-2, activating the Passd and Passdb signals 511 (e.g., in association with an AND or OR operation) transfers the accumulated output stored in the secondary latch of compute component 431 to the primary latch of sense amp 406. For instance, for an AND operation, if any of the memory cells sensed in the prior operation phases (e.g., the first operation phase of FIG. 5A and one or more iterations of the intermediate operation phase of FIG. 5B-1) stored a logic 0 (e.g., if any of the R-inputs of the AND operation were a logic 0), then the sense line D_ will carry a voltage corresponding to logic 1 (e.g., VDD) and sense line D will carry a voltage corresponding to logic 0 (e.g., ground). For this AND example, if all of the memory cells sensed in the prior operation phases stored a logic 1 (e.g., all of the R-inputs of the AND operation were logic 1), then the sense line D_ will carry a voltage corresponding to logic 0 and sense line D will carry a voltage corresponding to logic 1. At time t3, the primary latch of sense amp 206 is then enabled and the sense line D now carries the ANDed result of the respective input data values as determined from the memory cells sensed during the prior operation phases. As such, sense line D will be at ground if any of the input data values are a logic 0 and sense line D will be at VDD if all of the input data values are a logic 1.

For an OR operation, if any of the memory cells sensed in the prior operation phases (e.g., the first operation phase of FIG. 5A and one or more iterations of the intermediate operation phase shown in FIG. 5B-2) stored a logic 1 (e.g., if any of the R-inputs of the OR operation were a logic 1), then the sense line D_ will carry a voltage corresponding to logic 0 (e.g., ground) and sense line D will carry a voltage corresponding to logic 1 (e.g., VDD). For this OR example, if all of the memory cells sensed in the prior operation phases stored a logic 0 (e.g., all of the R-inputs of the OR operation were logic 0), then the sense line D will carry a voltage corresponding to logic 0 and sense line D_ will carry a voltage corresponding to logic 1. At time t3, the primary latch of the sense amp (e.g., sense amp 406 is then enabled and the sense line D now carries the ORed result of the respective input data values as determined from the memory cells sensed during the prior operation phases. As such, sense line D will be at VDD if any of the input data values are a logic 1 and sense line D will be at ground if all of the input data values are a logic 0.

The result of the R-input AND, OR, NAND, and NOR operations can then be stored back to a memory cell of the array (e.g., array 430). In the examples shown in FIGS. 5C-1 and 5C-2, the result of the R-input logical operation is stored to a memory cell coupled to RowN (e.g., 404-N in FIG. 4). Storing the result of the logical operation to the RowN memory cell simply involves enabling the RowN access transistor 402 by enabling RowN. The capacitor 403 of the RowN memory cell will be driven to a voltage corresponding to the data value on the sense line D (e.g., logic 1 or logic 0), which essentially overwrites whatever data value was previously stored in the RowN memory cell. It is noted that the RowN memory cell can be a same memory cell that stored a data value used as an input for the logical operation. For instance, the result of the logical operation can be stored back to the Row0 memory cell or Row1 memory cell.

Timing diagrams 585-4 and 585-5 illustrate, at time t3, the positive control signal 531 and the negative control signal 528 being deactivated (e.g., signal 531 goes high and signal 528 goes low) to enable the sense amp 406. At time t4 the respective signal (e.g., 513 or 511) that was activated at time t2 is deactivated. Embodiments are not limited to this example. For instance, in a number of embodiments, the sense amp 406 may be enabled subsequent to time t4 (e.g., after signal 513 or signals 511 are deactivated).

As shown in FIGS. 5C-1 and 5C-2, at time t5, RowR (404-R) is enabled, which drives the capacitor 403 of the selected cell to the voltage corresponding to the logic value stored in the compute component. At time t6, Row R is disabled, at time t7, the sense amp 406 is disabled (e.g., signals 528 and 531 are deactivated) and at time t8 equilibration occurs (e.g., signal 526 is activated and the voltages on the complementary sense lines 405-1/405-2 are brought to the equilibration voltage).

In a number of embodiments, sensing circuitry such as that described in FIG. 4 (e.g., circuitry formed on pitch with the memory cells) can enable performance of numerous logical operations in parallel. For instance, in an array having 16K columns, 16K logical operations can be performed in parallel, without transferring data from the array and sensing circuitry via I/O lines (e.g., via a bus). As such, the sensing circuitry can be operated to perform a plurality of (e.g., 16K) parity calculations (e.g., XOR operations) in a number of embodiments.

Embodiments of the present disclosure are not limited to the particular sensing circuitry configuration illustrated in FIG. 4. For instance, different compute component architectures can be used to perform logical operations in accordance with a number of embodiments described herein. For instance, an alternative compute component architecture is illustrated in FIG. 7. Although not illustrated in FIG. 4, in a number of embodiments, control circuitry (e.g., control circuitry 140 shown in FIG. 1) can be coupled to array 430, sense amp 406, and/or compute component 431. Such control circuitry may be implemented on a same chip as the array and sensing circuitry and/or on an external processing resource such as an external processor, for instance, and can control activating/deactivating various signals corresponding to the array and sensing circuitry in order to perform logical operations as described herein.

Figure 6:
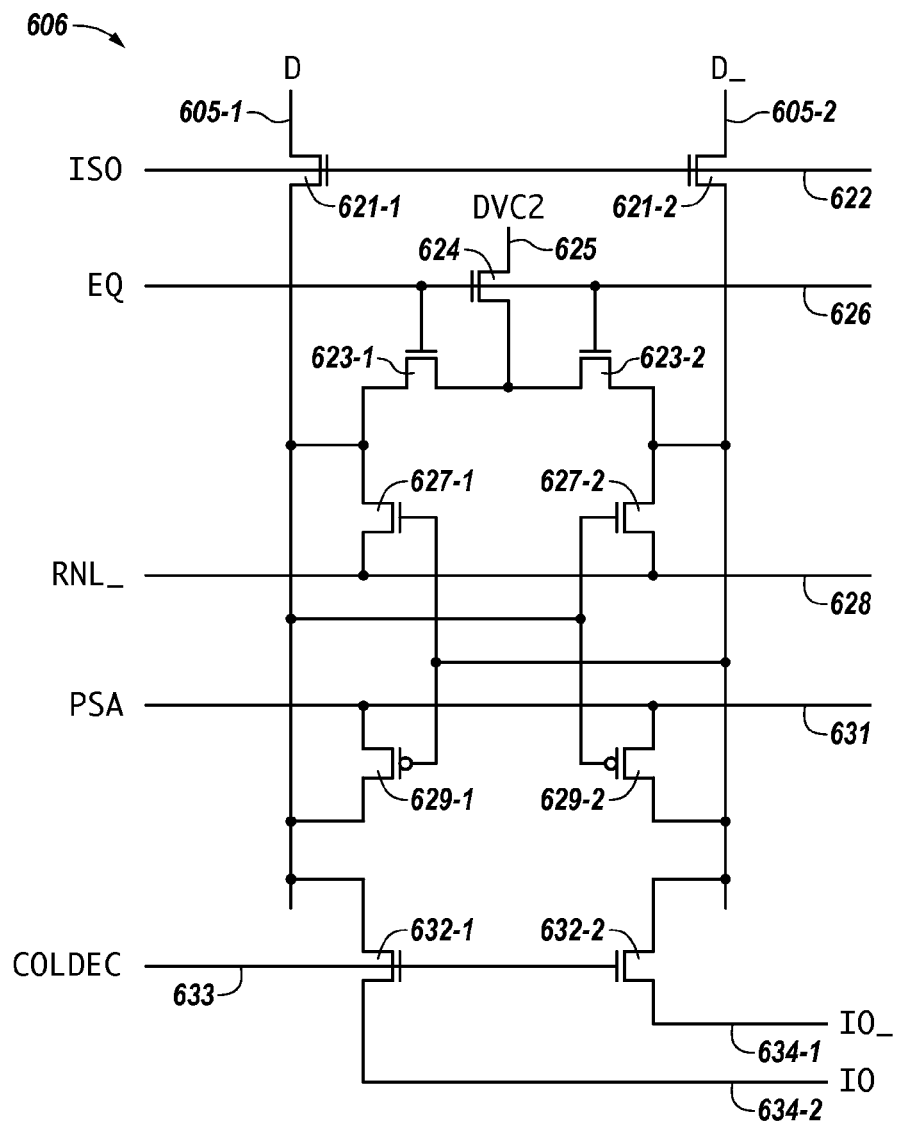
FIG. 6 illustrates a schematic diagram of a portion of sensing circuitry in accordance with a number of embodiments of the present disclosure.

FIG. 6 illustrates a schematic diagram of a portion of sensing circuitry in accordance with a number of embodiments of the present disclosure. In this example, the portion of sensing circuitry comprises a sense amplifier 306. In a number of embodiments, one sense amplifier 606 (e.g., "sense amp") is provided for each column of memory cells in an array (e.g., array 130). The sense amp 606 can be sense amp of a DRAM array, for instance. In this example, sense amp 606 is coupled to a pair of complementary sense lines 605-1 ("D") and 305-2 ("D_"). As such, the sense amp 606 is coupled to all of the memory cells in a respective column through sense lines D and D_.

The sense amplifier 606 includes a pair of cross coupled n-channel transistors (e.g., NMOS transistors) 627-1 and 627-2 having their respective sources coupled to a negative control signal 628 (RNL_) and their drains coupled to sense lines D and D_, respectively. The sense amplifier 606 also includes a pair of cross coupled p-channel transistors (e.g., PMOS transistors) 629-1 and 629-2 having their respective sources coupled to a positive control signal 631 (PSA) and their drains coupled to sense lines D and D_, respectively.

The sense amp 606 includes a pair of isolation transistors 621-1 and 621-2 coupled to sense lines D and D_, respectively. The isolation transistors 621-1 and 621-2 are coupled to a control signal 622 (ISO) that, when activated, enables (e.g., turns on) the transistors 621-1 and 621-2 to connect the sense amp 306 to a column of memory cells. Although not illustrated in FIG. 6, the sense amp 606 may be coupled to a first and a second memory array and can include another pair of isolation transistors coupled to a complementary control signal (e.g., ISO), which is deactivated when ISO is deactivated such that the sense amp 606 is isolated from a first array when sense amp 606 is coupled to a second array, and vice versa.

The sense amp 606 also includes circuitry configured to equilibrate the sense lines D and D_. In this example, the equilibration circuitry comprises a transistor 624 having a first source/drain region coupled to an equilibration voltage 625 (dvc2), which can be equal to VDD/2, where VDD is a supply voltage associated with the array. A second source/drain region of transistor 624 is coupled to a common first source/drain region of a pair of transistors 623-1 and 623-2. The second source drain regions of transistors 623-1 and 623-2 are coupled to sense lines D and D_, respectively. The gates of transistors 624, 623-1, and 623-2 are coupled to control signal 626 (EQ). As such, activating EQ enables the transistors 624, 623-1, and 623-2, which effectively shorts sense line D to sense line D such that the sense lines D and D_ are equilibrated to equilibration voltage dvc2.

The sense amp 606 also includes transistors 632-1 and 632-2 whose gates are coupled to a signal 633 (COLDEC). Signal 633 may be referred to as a column decode signal or a column select signal. The sense lines D and D_ are connected to respective local I/O lines 634-1 (IO) and 334-2 (IO) responsive to activating signal 633 (e.g., to perform an operation such as a sense line access in association with a read operation). As such, signal 633 can be activated to transfer a signal corresponding to the state (e.g., a logic data value such as logic 0 or logic 1) of the memory cell being accessed out of the array on the I/O lines 634-1 and 634-2.

In operation, when a memory cell is being sensed (e.g., read), the voltage on one of the sense lines D, D_ will be slightly greater than the voltage on the other one of sense lines D, D_. The PSA signal is then driven high and the RNL_signal is driven low to enable the sense amplifier 606. The sense line D, D having the lower voltage will turn on one of the PMOS transistor 629-1, 629-2 to a greater extent than the other of PMOS transistor 629-1, 629-2, thereby driving high the sense line D, D_ having the higher voltage to a greater extent than the other sense line D, D_ is driven high. Similarly, the sense line D, D_ having the higher voltage will turn on one of the NMOS transistor 627-1, 627-2 to a greater extent than the other of the NMOS transistor 627-1, 627-2, thereby driving low the sense line D, D_ having the lower voltage to a greater extent than the other sense line D, D_ is driven low. As a result, after a short delay, the sense line D, D_ having the slightly greater voltage is driven to the voltage of the PSA signal (which can be the supply voltage VDD), and the other sense line D, D_ is driven to the voltage of the RNL_signal (which can be a reference potential such as a ground potential). Therefore, the cross coupled NMOS transistors 627-1, 627-2 and PMOS transistors 629-1, 629-2 serve as a sense amp pair, which amplify the differential voltage on the sense lines D and D_ and serve to latch a data value sensed from the selected memory cell. As used herein, the cross coupled latch of sense amp 306 may be referred to as a primary latch. In contrast, and as described above in connection with FIG. 4, a cross coupled latch associated with an compute component (e.g., compute component 431 shown in FIG. 4) may be referred to as a secondary latch.

Figure 7A:
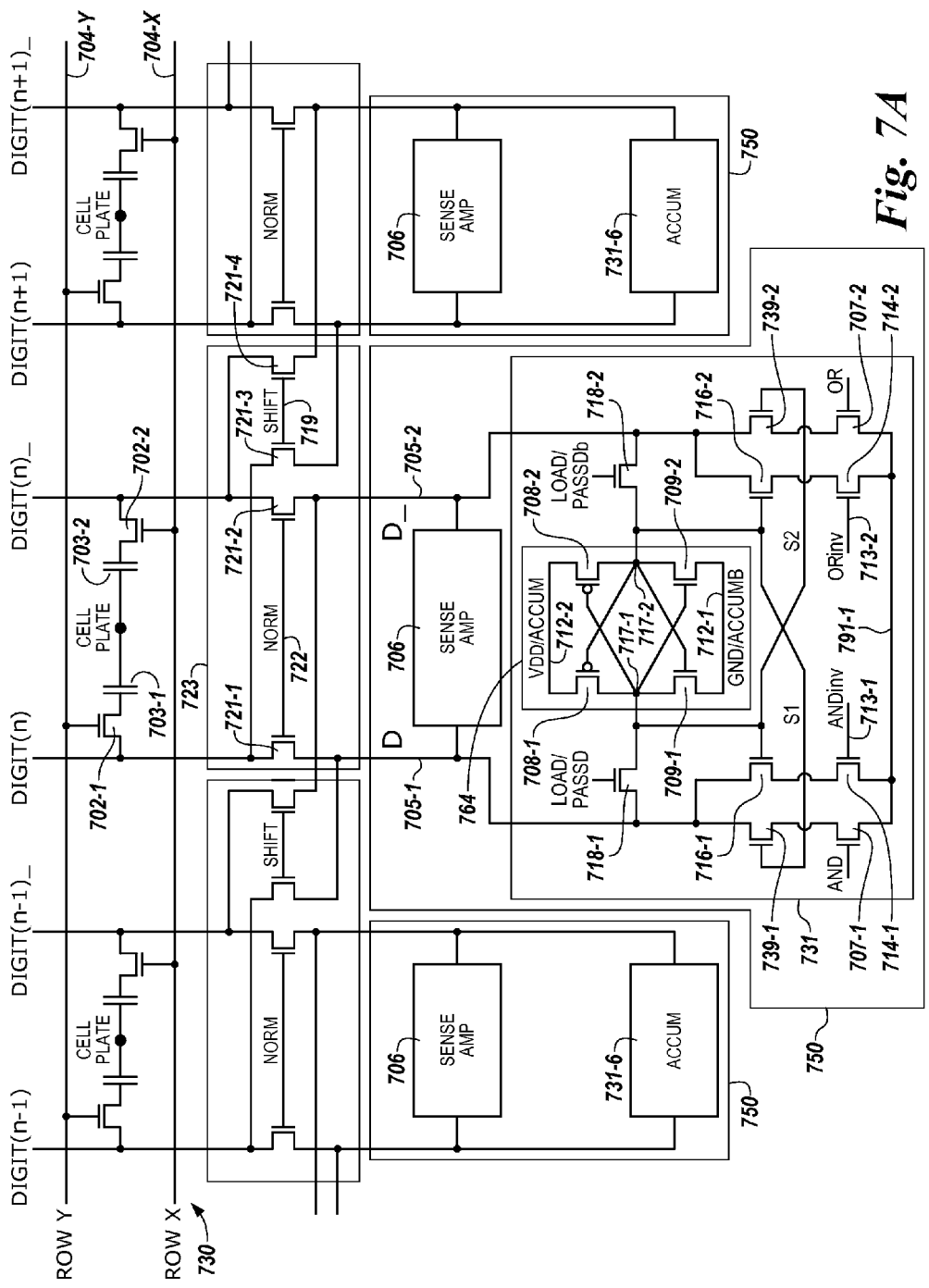
FIGS. 7A-7B illustrate schematic diagrams of portions of a memory array in accordance with a number of embodiments of the present disclosure.

FIG. 7A is a schematic diagram illustrating sensing circuitry in accordance with a number of embodiments of the present disclosure. A memory cell comprises a storage element (e.g., capacitor) and an access device (e.g., transistor). For instance, transistor 702-1 and capacitor 703-1 comprises a memory cell, and transistor 702-2 and capacitor 703-2 comprises a memory cell, etc. In this example, the memory array 730 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 730 are arranged in rows coupled by word lines 704-X (Row X), 704-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 705-1 (D) and 705-2 (D_) respectively. Although only three pair of complementary data lines are shown in FIG. 7A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 702-1 can be coupled to data line 705-1 (D), a second source/drain region of transistor 702-1 can be coupled to capacitor 703-1, and a gate of a transistor 702-1 can be coupled to word line 704-X. A first source/drain region of a transistor 702-2 can be coupled to data line 705-2 (D_), a second source/drain region of transistor 702-2 can be coupled to capacitor 703-2, and a gate of a transistor 702-2 can be coupled to word line 704-Y. The cell plate, as shown in FIG. 7A, can be coupled to each of capacitors 703-1 and 703-2. The cell plate can be a common node to which a reference voltage (e.g., ground) can be applied in various memory array configurations.

The memory array 730 is coupled to sensing circuitry 750 in accordance with a number of embodiments of the present disclosure. In this example, the sensing circuitry 750 comprises a sense amplifier 706 and a compute component 731 corresponding to respective columns of memory cells (e.g., coupled to respective pairs of complementary data lines). The sense amplifier 706 can comprise a cross coupled latch, which can be referred to herein as a primary latch. The sense amplifier 706 can be configured, for example, as described with respect to FIG. 7B.

In the example illustrated in FIG. 7A, the circuitry corresponding to compute component 731 comprises a static latch 764 and an additional ten transistors that implement, among other things, a dynamic latch. The dynamic latch and/or static latch of the compute component 731 can be collectively referred to herein as a secondary latch, which can serve as an accumulator. As such, the compute component 731 can operate as and/or be referred to herein as an accumulator. The compute component 731 can be coupled to each of the data lines D 705-1 and D_705-2 as shown in FIG. 7A. However, embodiments are not limited to this example. The transistors of compute component 731 can all be re-channel transistors (e.g., NMOS transistors), for example.

In this example, data line D 705-1 can be coupled to a first source/drain region of transistors 716-1 and 739-1, as well as to a first source/drain region of load/pass transistor 718-1. Data line D_705-2 can be coupled to a first source/drain region of transistors 716-2 and 739-2, as well as to a first source/drain region of load/pass transistor 718-2.

The gates of load/pass transistor 718-1 and 718-2 can be commonly coupled to a LOAD control signal, or respectively coupled to a PASSD/PASSDB control signal, as discussed further below. A second source/drain region of load/pass transistor 718-1 can be directly coupled to the gates of transistors 716-1 and 739-2. A second source/drain region of load/pass transistor 718-2 can be directly coupled to the gates of transistors 716-2 and 739-1.

A second source/drain region of transistor 716-1 can be directly coupled to a first source/drain region of pull-down transistor 714-1. A second source/drain region of transistor 739-1 can be directly coupled to a first source/drain region of pull-down transistor 707-1. A second source/drain region of transistor 716-2 can be directly coupled to a first source/drain region of pull-down transistor 714-2. A second source/drain region of transistor 739-2 can be directly coupled to a first source/drain region of pull-down transistor 707-2. A second source/drain region of each of pull-down transistors 707-1, 707-2, 714-1, and 714-2 can be commonly coupled together to a reference voltage 791-1 (e.g., ground (GND)). A gate of pull-down transistor 707-1 can be coupled to an AND control signal line, a gate of pull-down transistor 714-1 can be coupled to an ANDinv control signal line 713-1, a gate of pull-down transistor 714-2 can be coupled to an ORinv control signal line 713-2, and a gate of pull-down transistor 707-2 can be coupled to an OR control signal line.

The gate of transistor 739-1 can be referred to as node S1, and the gate of transistor 739-2 can be referred to as node S2. The circuit shown in FIG. 7A stores accumulator data dynamically on nodes S1 and S2. Activating the LOAD control signal causes load/pass transistors 718-1 and 718-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 7A is not contingent on the LOAD control signal being elevated to a voltage greater than $V_{DD}$.

The configuration of compute component 731 shown in FIG. 7A has the benefit of balancing the sense amplifier for functionality when the pull-down transistors 707-1, 707-2, 714-1, and 714-2 are conducting before the sense amplifier 706 is fired (e.g., during pre-seeding of the sense amplifier 706). As used herein, firing the sense amplifier 706 refers to enabling the sense amplifier 706 to set the primary latch and subsequently disabling the sense amplifier 706 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 716-1 (having a gate coupled to S2 of the dynamic latch) in series with transistor 714-1 (having a gate coupled to an ANDinv control signal line 713-1) can be operated to pull-down data line 705-1 (D), and transistor 716-2 (having a gate coupled to S1 of the dynamic latch) in series with transistor 714-2 (having a gate coupled to an ANDinv control signal line 713-2) can be operated to pull-down data line 705-2 (D_).

The latch 764 can be controllably enabled by coupling to an active negative control signal line 712-1 (ACCUMB) and an active positive control signal line 712-2 (ACCUM) rather than be configured to be continuously enabled by coupling to ground and $V_{DD}$. In various embodiments, load/pass transistors 708-1 and 708-2 can each having a gate coupled to one of a LOAD control signal or a PASSD/PASSDB control signal.

According to some embodiments, the gates of load/pass transistors 718-1 and 718-2 can be commonly coupled to a LOAD control signal. In the configuration where the gates of load/pass transistors 718-1 and 718-2 are commonly coupled to the LOAD control signal, transistors 718-1 and 718-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 7A is not contingent on the LOAD control signal being elevated to a voltage greater than $V_{DD}$.

According to some embodiments, the gate of load/pass transistor 718-1 can be coupled to a PASSD control signal, and the gate of load/pass transistor 718-2 can be coupled to a PASSDb control signal. In the configuration where the gates of transistors 718-1 and 718-2 are respectively coupled to one of the PASSD and PASSDb control signals, transistors 718-1 and 718-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 723, as shown in FIG. 7A). According to some embodiments, load/pass transistors 718-1 and 718-2 can be configured to accommodate the heavier loading corresponding to a pass transistor but be coupled and operated as a load transistor. Load/pass transistors 718-1 and 718-2 configured as pass transistors can also be utilized as load transistors. However, load/pass transistors 718-1 and 718-2 configured as load transistors may not be capable of being utilized as pass transistors.

In a number of embodiments, the compute component 731, including the latch 764, can comprise a number of transistors formed on pitch with the transistors of the corresponding memory cells of an array (e.g., array 730 shown in FIG. 7A) to which they are coupled, which may conform to a particular feature size (e.g., $4F^2$, $6F^2$, etc.). According to various embodiments, latch 764 includes four transistors 708-1, 708-2, 709-1, and 709-2 coupled to a pair of complementary data lines D 705-1 and D_ 705-2 through load/pass transistors 718-1 and 718-2. However, embodiments are not limited to this configuration. The latch 764 can be a cross coupled latch (e.g., gates of a pair of transistors, such as n-channel transistors (e.g., NMOS transistors) 709-1 and 709-2 are cross coupled with the gates of another pair of transistors, such as p-channel transistors (e.g., PMOS transistors) 708-1 and 708-2). As described further herein, the cross coupled latch 764 can be referred to as a static latch.

The voltages or currents on the respective data lines D and D_ can be provided to the respective latch inputs 717-1 and 717-2 of the cross coupled latch 764 (e.g., the input of the secondary latch). In this example, the latch input 717-1 is coupled to a first source/drain region of transistors 708-1 and 709-1 as well as to the gates of transistors 708-2 and 709-2. Similarly, the latch input 717-2 can be coupled to a first source/drain region of transistors 708-2 and 709-2 as well as to the gates of transistors 708-1 and 709-1.

Figure 7B:
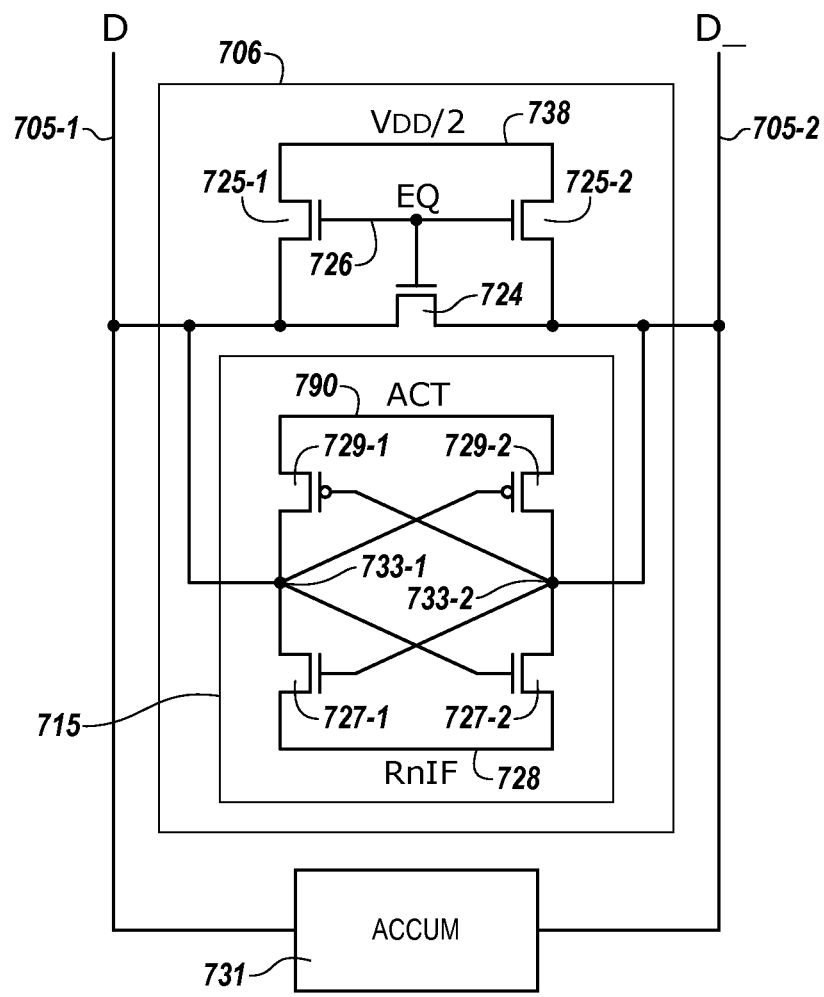

In this example, a second source/drain region of transistor 709-1 and 709-2 is commonly coupled to a negative control signal line 712-1 (e.g., ground (GND) or ACCUMB control signal similar to control signal RnIF shown in FIG. 7B with respect to the primary latch). A second source/drain region of transistors 708-1 and 708-2 is commonly coupled to a positive control signal line 712-2 (e.g., $V_{DD}$ or ACCUM control signal similar to control signal ACT shown in FIG. 7B with respect to the primary latch). The positive control signal 712-2 can provide a supply voltage (e.g., $V_{DD}$) and the negative control signal 712-1 can be a reference voltage (e.g., ground) to enable the cross coupled latch 764. According to some embodiments, the second source/drain region of transistors 708-1 and 708-2 are commonly coupled directly to the supply voltage (e.g., $V_{DD}$), and the second source/drain region of transistor 709-1 and 709-2 are commonly coupled directly to the reference voltage (e.g., ground) so as to continuously enable latch 764.

The enabled cross coupled latch 764 operates to amplify a differential voltage between latch input 717-1 (e.g., first common node) and latch input 717-2 (e.g., second common node) such that latch input 717-1 is driven to either the activated positive control signal voltage (e.g., $V_{DD}$) or the activated negative control signal voltage (e.g., ground), and latch input 717-2 is driven to the other of the activated positive control signal voltage (e.g., $V_{DD}$) or the activated negative control signal voltage (e.g., ground).

As shown in FIG. 7A, the sense amplifier 706 and the compute component 731 can be coupled to the array 730 via shift circuitry 723. In this example, the shift circuitry 723 comprises a pair of isolation devices (e.g., isolation transistors 721-1 and 721-2) coupled to data lines 705-1 (D) and 705-2 (D_), respectively). The isolation transistors 721-1 and 721-2 are coupled to a control signal 722 (NORM) that, when activated, enables (e.g., turns on) the isolation transistors 721-1 and 721-2 to couple the corresponding sense amplifier 706 and compute component 731 to a corresponding column of memory cells (e.g., to a corresponding pair of complementary data lines 705-1 (D) and 705-2 (D_)). According to various embodiments, conduction of isolation transistors 721-1 and 721-2 can be referred to as a "normal" configuration of the shift circuitry 723.

In the example illustrated in FIG. 7A, the shift circuitry 723 includes another (e.g., a second) pair of isolation devices (e.g., isolation transistors 721-3 and 721-4) coupled to a complementary control signal 719 (SHIFT), which can be activated, for example, when NORM is deactivated. The isolation transistors 721-3 and 721-4 can be operated (e.g., via control signal 719) such that a particular sense amplifier 706 and compute component 731 are coupled to a different pair of complementary data lines (e.g., a pair of complementary data lines different than the pair of complementary data lines to which isolation transistors 721-1 and 721-2 couple the particular sense amplifier 706 and compute component 731), or can couple a particular sense amplifier 706 and compute component 731 to another memory array (and isolate the particular sense amplifier 706 and compute component 731 from a first memory array). According to various embodiments, the shift circuitry 723 can be arranged as a portion of (e.g., within) the sense amplifier 706, for instance.

Although the shift circuitry 723 shown in FIG. 7A includes isolation transistors 721-1 and 721-2 used to couple particular sensing circuitry 750 (e.g., a particular sense amplifier 706 and corresponding compute component 731) to a particular pair of complementary data lines 705-1 (D) and 705-2 (D_) (e.g., DIGIT(n) and DIGIT(n)_) and isolation transistors 721-3 and 721-4 are arranged to couple the particular sensing circuitry 750 to an adjacent pair of complementary data lines in one particular direction (e.g., adjacent data lines DIGIT(n+1) and DIGIT(n+1)_ shown to the right in FIG. 7A), embodiments of the present disclosure are not so limited. For instance, shift circuitry can include isolation transistors 721-1 and 721-2 used to couple particular sensing circuitry to a particular pair of complementary data lines (e.g., DIGIT(n) and DIGIT(n)_ and isolation transistors 721-3 and 721-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 7A).

Embodiments of the present disclosure are not limited to the configuration of shift circuitry 723 shown in FIG. 7A. In a number of embodiments, shift circuitry 723 such as that shown in FIG. 7A can be operated (e.g., in conjunction with sense amplifiers 706 and compute components 731) in association with performing compute functions such as adding and subtracting functions without transferring data out of the sensing circuitry 750 via an I/O line (e.g., local I/O line (IO/IO_)), for instance.

Although not shown in FIG. 7A, each column of memory cells can be coupled to a column decode line that can be enabled to transfer, via local I/O line, a data value from a corresponding sense amplifier 706 and/or compute component 731 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 723 can be operated in conjunction with sense amplifiers 706 and compute components 731 to perform compute functions such as adding and subtracting functions without transferring data to a control component external to the array, for instance.

FIG. 7B is a schematic diagram illustrating a portion of sensing circuitry in accordance with a number of embodiments of the present disclosure. According to various embodiments, sense amplifier 706 can comprise a cross coupled latch. However, embodiments of the sense amplifier 706 are not limited to the a cross coupled latch. As an example, the sense amplifier 706 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 706) can comprise a number of transistors formed on pitch with the transistors of the corresponding compute component 731 and/or the memory cells of an array (e.g., 730) shown in FIG. 7A) to which they are coupled, which may conform to a particular feature size (e.g., $4F^2$, $6F^2$, etc.). The sense amplifier 706 comprises a latch 715 including four transistors coupled to a pair of complementary data lines D 705-1 and D_ 705-2. The latch 715 can be a cross coupled latch (e.g., gates of a pair of transistors, such as n-channel transistors (e.g., NMOS transistors) 727-1 and 727-2 are cross coupled with the gates of another pair of transistors, such as p-channel transistors (e.g., PMOS transistors) 729-1 and 729-2). As described further herein, the latch 715 comprising transistors 727-1, 727-2, 729-1, and 729-2 can be referred to as a primary latch. However, embodiments are not limited to this example.

The voltages or currents on the respective data lines D and D_ can be provided to the respective latch inputs 733-1 and 733-2 of the cross coupled latch 715 (e.g., the input of the secondary latch). In this example, the latch input 733-1 is coupled to a first source/drain region of transistors 727-1 and 729-1 as well as to the gates of transistors 727-2 and 729-2. Similarly, the latch input 733-2 can be coupled to a first source/drain region of transistors 727-2 and 729-2 as well as to the gates of transistors 727-1 and 729-1. The compute component 733 (e.g., accumulator) can be coupled to latch inputs 733-1 and 733-2 of the cross coupled latch 715 as shown; however, embodiments are not limited to the example shown in FIG. 7B.

In this example, a second source/drain region of transistor 727-1 and 727-2 is commonly coupled to an active negative control signal 728 (RnIF) A second source/drain region of transistors 729-1 and 729-2 is commonly coupled to an active positive control signal 790 (ACT). The ACT signal 790 can be a supply voltage (e.g., $V_{DD}$) and the RnIF signal can be a reference voltage (e.g., ground). Activating signals 728 and 790 enables the cross coupled latch 715.

The enabled cross coupled latch 715 operates to amplify a differential voltage between latch input 733-1 (e.g., first common node) and latch input 733-2 (e.g., second common node) such that latch input 733-1 is driven to one of the ACT signal voltage and the RnIF signal voltage (e.g., to one of $V_{DD}$ and ground), and latch input 733-2 is driven to the other of the ACT signal voltage and the RnIF signal voltage.

The sense amplifier 706 can also include circuitry configured to equilibrate the data lines D and D_ (e.g., in association with preparing the sense amplifier for a sensing operation). In this example, the equilibration circuitry comprises a transistor 724 having a first source/drain region coupled to a first source/drain region of transistor 725-1 and data line D 705-1. A second source/drain region of transistor 724 can be coupled to a first source/drain region of transistor 725-2 and data line D_ 705-2. A gate of transistor 724 can be coupled to gates of transistors 725-1 and 725-2.

The second source drain regions of transistors 725-1 and 725-2 are coupled to an equilibration voltage 738 (e.g., $V_{DD}/2$), which can be equal to $V_{DD}/2$, where $V_{DD}$ is a supply voltage associated with the array. The gates of transistors 724, 725-1, and 725-2 can be coupled to control signal 725 (EQ). As such, activating EQ enables the transistors 724, 725-1, and 725-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

The sensing circuitry 750 can be operated in several modes to perform logical operations, including a first mode in which a result of the logical operation is initially stored in the sense amplifier 706, and a second mode in which a result of the logical operation is initially stored in the compute component 731. Operation of the sensing circuitry 750 in the first mode is described below with respect to FIGS. 8A and 8B, and operation of the sensing circuitry 750 in the second mode is described below with respect to FIGS. 5A through 5C-2. Additionally with respect to the first operating mode, sensing circuitry 750 can be operated in both pre-sensing (e.g., sense amps fired before logical operation control signal active) and post-sensing (e.g., sense amps fired after logical operation control signal active) modes with a result of a logical operation being initially stored in the sense amplifier 706.

As described further below, the sense amplifier 706 can, in conjunction with the compute component 731, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated there-with using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 750 of FIG. 7A is described below and summarized in Table 1 below with respect to performing logical operations and initially storing a result in the sense amplifier 706. Initially storing the result of a particular logical operation in the primary latch of sense amplifier 706 can provide improved versatility as compared to previous approaches in which the result may initially reside in a secondary latch (e.g., accumulator) of a compute component 731, and then be subsequently transferred to the sense amplifier 706, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 706 (e.g., without having to perform an additional operation to move the result from the compute component 731 (e.g., accumulator) to the sense amplifier 706) is advantageous because, for instance, the result can be written to a row (of the array of memory cells) or back into the accumulator without performing a precharge cycle (e.g., on the complementary data lines 705-1 (D) and/or 705-2 (D_)).

Figure 8A:
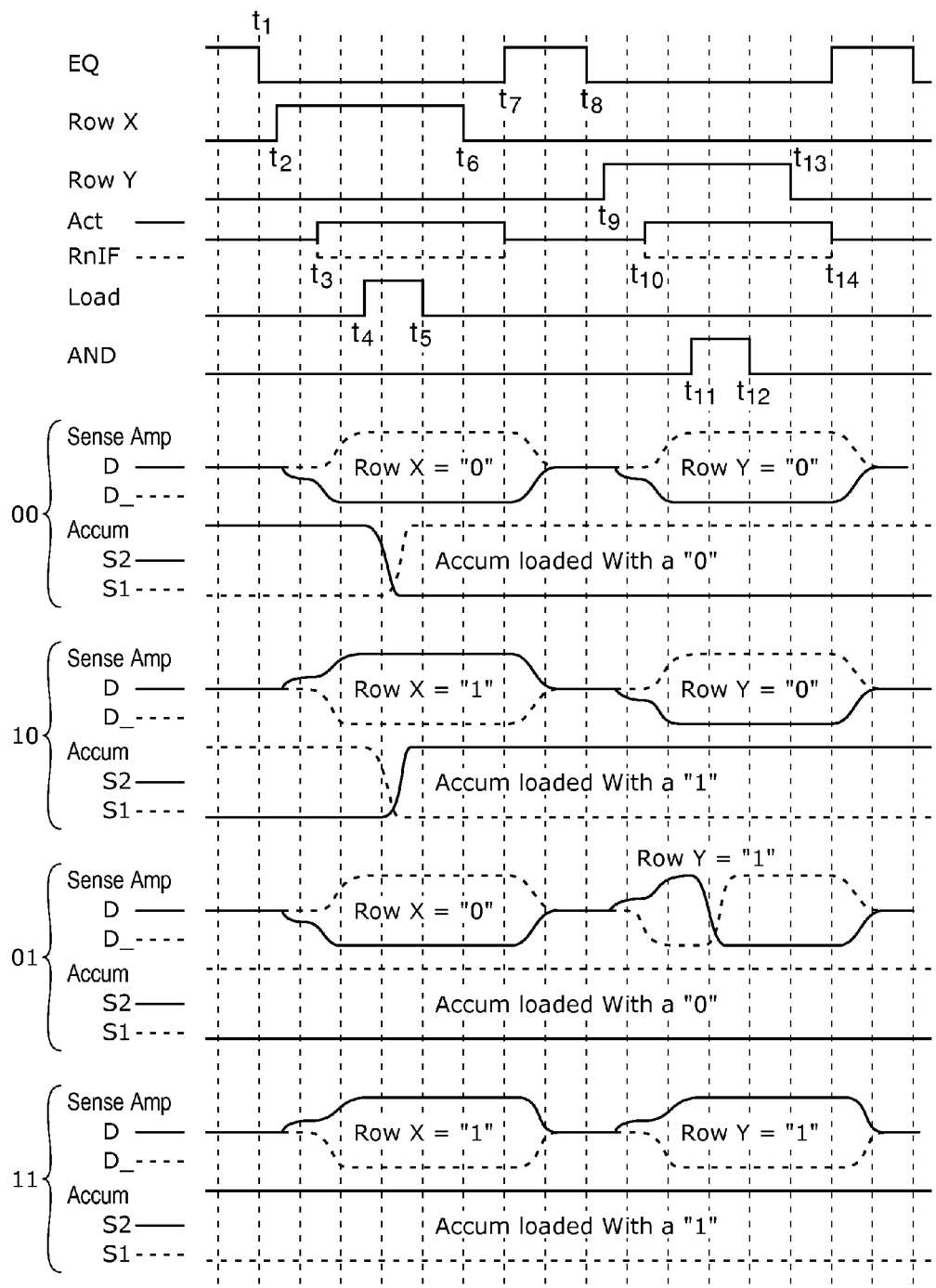
FIGS. 8A-8B illustrate timing diagrams associated with performing a number of logical operations using sensing circuitry in accordance with a number of embodiments of the present disclosure.

FIG. 8A illustrates a timing diagram associated with performing a number of logical operations using sensing circuitry in accordance with a number of embodiments of the present disclosure. FIG. 8A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 8A illustrates a number of control signals associated with operating sensing circuitry (e.g., 750) to perform the AND logical operation. "EQ" corresponds to an equilibrate signal applied to the sense amp 706, "ROW X" corresponds to an activation signal applied to access line 704-X, "ROW Y" corresponds to an activation signal applied to access line 704-Y, "Act" and "RnIF" correspond to a respective active positive and negative control signal applied to the sense amp 706, "LOAD" corresponds to a load control signal (e.g., LOAD/PASSD and LOAD/PASSDb shown in FIG. 7A), and "AND" corresponds to the AND control signal shown in FIG. 7A. FIG. 8A also illustrates the waveform diagrams showing the signals (e.g., voltage signals) on the digit lines D and D_ corresponding to sense amp 706 and on the nodes S1 and S2 corresponding to the compute component 731 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 7A.

An example of pseudo code associated with loading (e.g., copying) a first data value stored in a cell coupled to row 704-X into the accumulator can be summarized as follows:

Copy Row X into the Accumulator:
    Deactivate EQ
    Open Row X
    Fire Sense Amps (after which Row X data resides in the sense amps)
    Activate LOAD (sense amplifier data (Row X) is transferred to nodes
       S1 and S2 of the Accumulator and resides there dynamically)
    Deactivate LOAD
    Close Row X
    Precharge In the pseudo code above, "Deactivate EQ" indicates that an equilibration signal (EQ signal shown in FIG. 8A) corresponding to the sense amplifier 706 is disabled at $t_1$ as shown in FIG. 8A (e.g., such that the complementary data lines (e.g., 705-1 (D) and 705-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 8A. When the voltage signal applied to ROW X reaches the threshold voltage (Vt) of the access transistor (e.g., 702-2) corresponding to the selected cell, the access transistor turns on and couples the data line (e.g., 705-2 (D_)) to the selected cell (e.g., to capacitor 703-2) which creates a differential voltage signal between the data lines.

After Row X is enabled, in the pseudo code above, "Fire Sense Amps" indicates that the sense amplifier 706 is enabled to set the primary latch and subsequently disabled. For example, as shown at $t_3$ in FIG. 8A, the ACT positive control signal (e.g., 790 shown in FIG. 7B) goes high and the RnIF negative control signal (e.g., 728 shown in FIG. 7B) goes low, which amplifies the differential signal between 705-1 (D) and D_705-2, resulting in a voltage (e.g., $V_{DD}$) corresponding to a logic 1 or a voltage (e.g., GND) corresponding to a logic 0 being on data line 705-1 (D) (and the voltage corresponding to the other logic state being on complementary data line 705-2 (D_)). The sensed data value is stored in the primary latch of sense amplifier 706. The primary energy consumption occurs in charging the data lines (e.g., 705-1 (D) or 705-2 (D_)) from the equilibration voltage $V_{DD}/2$ to the rail voltage $V_{DD}$.

The four sets of possible sense amplifier and accumulator signals illustrated in FIG. 8A (e.g., one for each combination of Row X and Row Y data values) shows the behavior of signals on data lines D and D_. The Row X data value is stored in the primary latch of the sense amp. It should be noted that FIG. 7A shows that the memory cell including storage element 702-2, corresponding to Row X, is coupled to the complementary data line D_, while the memory cell including storage element 702-1, corresponding to Row Y, is coupled to data line D. However, as can be seen in FIG. 7A, the charge stored in memory cell 702-2 (corresponding to Row X) corresponding to a "0" data value causes the voltage on data line D_ (to which memory cell 702-2 is coupled) to go high and the charge stored in memory cell 702-2 corresponding to a "1" data value causes the voltage on data line D_ to go low, which is opposite correspondence between data states and charge stored in memory cell 702-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 8A, causing load/pass transistors 718-1 and 718-2 to conduct. In this manner, activating the LOAD control signal enables the secondary latch in the accumulator of the compute component 731. The sensed data value stored in the sense amplifier 706 is transferred (e.g., copied) to the secondary latch. As shown for each of the four sets of possible sense amplifier and accumulator signals illustrated in FIG. 8A, the behavior at inputs of the secondary latch of the accumulator indicates the secondary latch is loaded with the Row X data value. As shown in FIG. 8A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 705-1 (D) and 705-2 (D_), in the pseudo code above, "Deactivate LOAD" indicates that the LOAD control signal goes back low as shown at $t_5$ in FIG. 8A to cause the load/pass transistors 718-1 and 718-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 8A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 8A by the EQ signal going high at $t_7$. As shown in each of the four sets of possible sense amplifier and accumulator signals illustrated in FIG. 8A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 706 and the secondary latch of the compute component 731) and the second data value (stored in a memory cell 702-1 coupled to Row Y 704-Y) includes performing particular steps which depend on the whether an AND or an OR is to be performed. Examples of pseudo code associated with "ANDing" and "ORing" the data value residing in the accumulator (e.g., the first data value stored in the memory cell 702-2 coupled to Row X 704-X) and the second data value (e.g., the data value stored in the memory cell 702-1 coupled to Row Y 704-Y) are summarized below. Example pseudo code associated with "ANDing" the data values can include:

---

Deactivate EQ
Open Row Y
Fire Sense Amps (after which Row Y data resides in the sense amps)
Close Row Y
    The result of the logic operation, in the next operation, will be placed
       on the sense amp, which will overwrite any row that is active.
    Even when Row Y is closed, the sense amplifier still contains the
       Row Y data value.
Activate AND
    This results in the sense amplifier being written to the value of the
       function (e.g., Row X AND Row Y)
    If the accumulator contains a "0" (i.e., a voltage corresponding to a
       "0" on node S2 and a voltage corresponding to a "1" on node S1),
       the sense amplifier data is written to a "0"
    If the accumulator contains a "1" (i.e., a voltage corresponding to a
       "1" on node S2 and a voltage corresponding to a "0" on node S1),
       the sense amplifier data remains unchanged (Row Y data)
    This operation leaves the data in the accumulator unchanged.
Deactivate AND
Precharge

---

In the pseudo code above, "Deactivate EQ" indicates that an equilibration signal corresponding to the sense amplifier 706 is disabled (e.g., such that the complementary data lines 705-1 (D) and 705-2 (D_) are no longer shorted to $V_{DD}/2$), which is illustrated in FIG. 8A at $t_8$. After equilibration is disabled, a selected row (e.g., ROW Y) is enabled as indicated in the pseudo code above by "Open Row Y" and shown in FIG. 8A at $t_9$. When the voltage signal applied to ROW Y reaches the threshold voltage (Vt) of the access transistor (e.g., 702-1) corresponding to the selected cell, the access transistor turns on and couples the data line (e.g., D_705-1) to the selected cell (e.g., to capacitor 703-1) which creates a differential voltage signal between the data lines.

After Row Y is enabled, in the pseudo code above, "Fire Sense Amps" indicates that the sense amplifier 706 is enabled to amplify the differential signal between 705-1 (D) and 705-2 (D_), resulting in a voltage (e.g., $V_{DD}$) corresponding to a logic 1 or a voltage (e.g., GND) corresponding to a logic 0 being on data line 705-1 (D) (and the voltage corresponding to the other logic state being on complementary data line 705-2 (D_)). As shown at $t_{10}$ in FIG. 8A, the ACT positive control signal (e.g., 790 shown in FIG. 7B) goes high and the RnIF negative control signal (e.g., 728 shown in FIG. 7B) goes low to fire the sense amps. The sensed data value from memory cell 702-1 is stored in the primary latch of sense amplifier 706, as previously described. The secondary latch still corresponds to the data value from memory cell 702-2 since the dynamic latch is unchanged.

After the second data value sensed from the memory cell 702-1 coupled to Row Y is stored in the primary latch of sense amplifier 706, in the pseudo code above, "Close Row Y" indicates that the selected row (e.g., ROW Y) can be disabled if it is not desired to store the result of the AND logical operation back in the memory cell corresponding to Row Y. However, FIG. 8A shows that Row Y is left enabled such that the result of the logical operation can be stored back in the memory cell corresponding to Row Y. Isolating the memory cell corresponding to Row Y can be accomplished by the access transistor turning off to decouple the selected cell 702-1 from the data line 705-1 (D). After the selected Row Y is configured (e.g., to isolate the memory cell or not isolate the memory cell), "Activate AND" in the pseudo code above indicates that the AND control signal goes high as shown in FIG. 8A at $t_{11}$, causing pass transistor 707-1 to conduct. In this manner, activating the AND control signal causes the value of the function (e.g., Row X AND Row Y) to be written to the sense amp.

With the first data value (e.g., Row X) stored in the dynamic latch of the accumulator 731 and the second data value (e.g., Row Y) stored in the sense amplifier 706, if the dynamic latch of the compute component 731 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 709-1 to conduct thereby coupling the sense amplifier 706 to ground through transistor 709-1, pass transistor 707-1 and data line 705-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 706. This operation leaves the data value in the accumulator unchanged (e.g., from Row X).

If the secondary latch of the accumulator contains a "1" (e.g., from Row X), then the result of the AND operation depends on the data value stored in the sense amplifier 706 (e.g., from Row Y). The result of the AND operation should be a "1" if the data value stored in the sense amplifier 706 (e.g., from Row Y) is also a "1," but the result of the AND operation should be a "0" if the data value stored in the sense amplifier 706 (e.g., from Row Y) is also a "0." The sensing circuitry 750 is configured such that if the dynamic latch of the accumulator contains a "1" (i.e., a voltage corresponding to a "1" on node S2 and a voltage corresponding to a "0" on node S1), transistor 709-1 does not conduct, the sense amplifier is not coupled to ground (as described above), and the data value previously stored in the sense amplifier 706 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 706, "Deactivate AND" in the pseudo code above indicates that the AND control signal goes low as shown at $t_{12}$ in FIG. 8A, causing pass transistor 707-1 to stop conducting to isolate the sense amplifier 706 (and data line 705-1 (D)) from ground. If not previously done, Row Y can be closed (as shown at $t_{13}$ in FIG. 8A) and the sense amplifier can be disabled (as shown at $t_{14}$ in FIG. 8A by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 8A).

FIG. 8A shows, in the alternative, the behavior of voltage signals on the data lines (e.g., 705-1 (D) and 705-2 (D_) shown in FIG. 7A) coupled to the sense amplifier (e.g., 706 shown in FIG. 7A) and the behavior of voltage signals on nodes S1 and S1 of the secondary latch of the compute component (e.g., 731 shown in FIG. 7A) for an AND logical operation involving each of the possible combination of operands (e.g., Row X/Row Y data values 00, 10, 01, and 11).

Although the timing diagrams illustrated in FIG. 8A and the pseudo code described above indicate initiating the AND logical operation after starting to load the second operand (e.g., Row Y data value) into the sense amplifier, the circuit shown in FIG. 7A can be successfully operated by initiating the AND logical operation before starting to load the second operand (e.g., Row Y data value) into the sense amplifier.

Figure 8B:
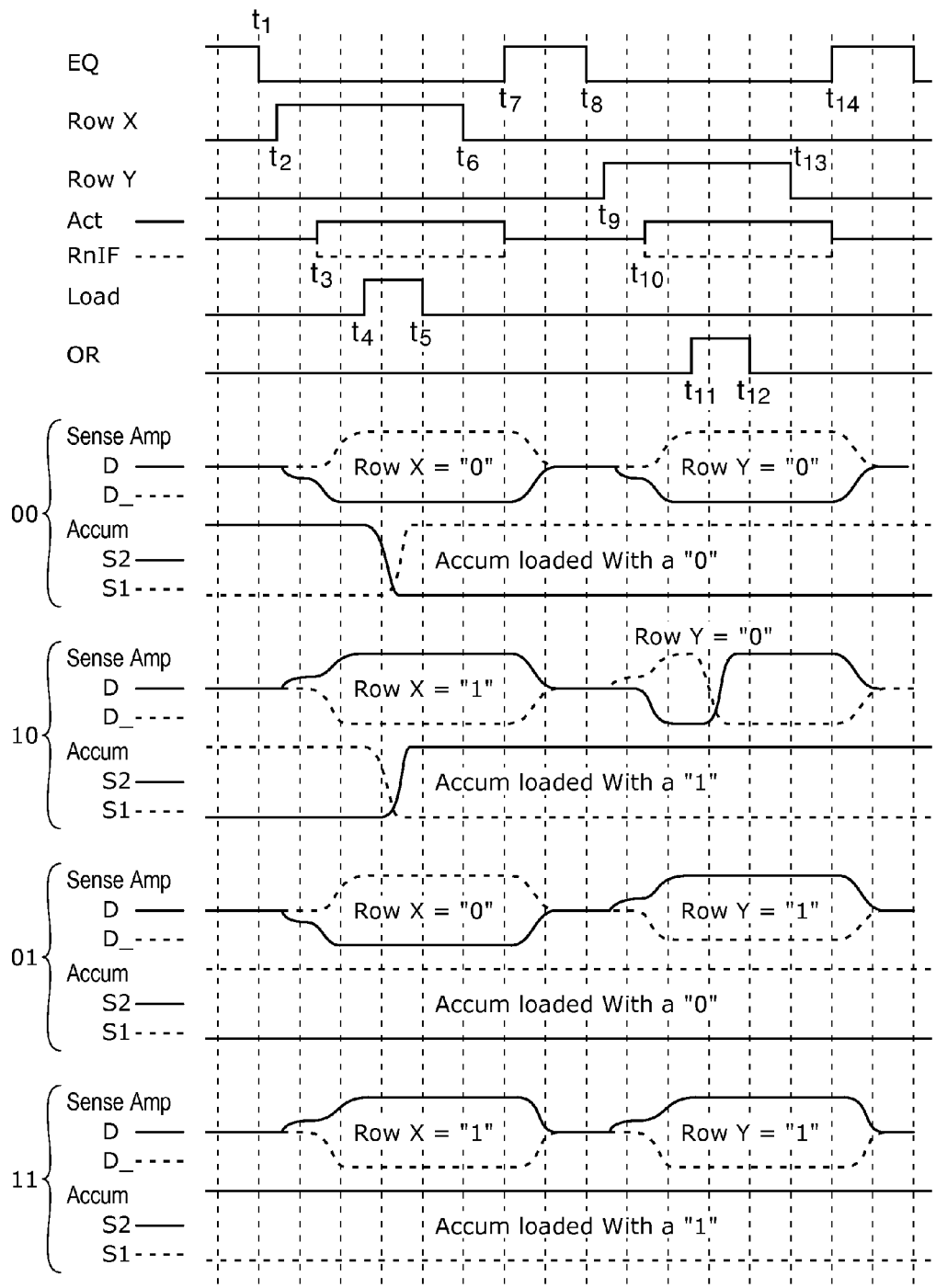

FIG. 8B illustrates a timing diagram associated with performing a number of logical operations using sensing circuitry in accordance with a number of embodiments of the present disclosure. FIG. 8B illustrates a timing diagram associated with initiating an OR logical operation after starting to load the second operand (e.g., Row Y data value) into the sense amplifier. FIG. 8B illustrates the sense amplifier and accumulator signals for various combinations of first and second operand data values. The particular timing diagram signals are discussed below with respect to the pseudo code associated with an AND logical operation of the circuit shown in FIG. 7A.

A subsequent operation phase can alternately be associated with performing the OR operation on the first data value (now stored in the sense amplifier 706 and the secondary latch of the compute component 731) and the second data value (stored in a memory cell 702-1 coupled to Row Y 704-Y). The operations to load the Row X data into the sense amplifier and accumulator that were previously described with respect to times $t_1$-$t_7$ shown in FIG. 8A are not repeated with respect to FIG. 8B. Example pseudo code associated with "ORing" the data values can include:

Deactivate EQ
Open Row Y
Fire Sense Amps (after which Row Y data resides in the sense amps)
Close Row Y
    When Row Y is closed, the sense amplifier still contains the Row Y data value.
Activate OR
    This results in the sense amplifier being written to the value of the function (e.g., Row X OR Row Y), which may overwrite the data value from Row Y previously stored in the sense amplifier as follows:
    If the accumulator contains a "0" (i.e., a voltage corresponding to a "0" on node S2 and a voltage corresponding to a "1" on node S1), the sense amplifier data remains unchanged (Row Y data)
    If the accumulator contains a "1" (i.e., a voltage corresponding to a "1" on node S2 and a voltage corresponding to a "0" on node S1), the sense amplifier data is written to a "1"
    This operation leaves the data in the accumulator unchanged.
Deactivate OR
Precharge The "Deactivate EQ" (shown at is in FIG. 8B), "Open Row Y" (shown at $t_9$ in FIG. 8B), "Fire Sense Amps" (shown at $t_{10}$ in FIG. 8B), and "Close Row Y" (shown at $t_{13}$ in FIG. 8B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 8B, which causes pass transistor 707-2 to conduct. In this manner, activating the OR control signal causes the value of the function (e.g., Row X OR Row Y) to be written to the sense amp.

With the first data value (e.g., Row X) stored in the secondary latch of the compute component 731 and the second data value (e.g., Row Y) stored in the sense amplifier 706, if the dynamic latch of the accumulator contains a "0" (i.e., a voltage corresponding to a "0" on node S2 and a voltage corresponding to a "1" on node S1), then the result of the OR operation depends on the data value stored in the sense amplifier 706 (e.g., from Row Y). The result of the OR operation should be a "1" if the data value stored in the sense amplifier 706 (e.g., from Row Y) is a "1," but the result of the OR operation should be a "0" if the data value stored in the sense amplifier 706 (e.g., from Row Y) is also a "0." The sensing circuitry 750 is configured such that if the dynamic latch of the accumulator contains a "0," with the voltage corresponding to a "0" on node S2, transistor 709-2 is off and does not conduct (and pass transistor 707-1 is also off since the AND control signal is not asserted) so the sense amplifier 706 is not coupled to ground (either side), and the data value previously stored in the sense amplifier 706 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 709-2 does conduct (as does pass transistor 707-2 since the OR control signal is asserted), and the sense amplifier 706 input coupled to data line 705-2 (D_) is coupled to ground since the voltage corresponding to a "1" on node S2 causes transistor 709-2 to conduct along with pass transistor 707-2 (which also conducts since the OR control signal is asserted). In this manner, a "1" is initially stored in the sense amplifier 706 as a result of the OR operation when the secondary latch of the accumulator contains a "1" regardless of the data value previously stored in the sense amp. This operation leaves the data in the accumulator unchanged. FIG. 8B shows, in the alternative, the behavior of voltage signals on the data lines (e.g., 705-1 (D) and 705-2 (D_) shown in FIG. 7A) coupled to the sense amplifier (e.g., 706 shown in FIG. 7A) and the behavior of voltage signals on nodes S1 and S2 of the secondary latch of the compute component 731 for an OR logical operation involving each of the possible combination of operands (e.g., Row X/Row Y data values 00, 10, 01, and 11).

After the result of the OR operation is initially stored in the sense amplifier 706, "Deactivate OR" in the pseudo code above indicates that the OR control signal goes low as shown at $t_{12}$ in FIG. 8B, causing pass transistor 707-2 to stop conducting to isolate the sense amplifier 706 (and data line D 705-2) from ground. If not previously done, Row Y can be closed (as shown at $t_{13}$ in FIG. 8B) and the sense amplifier can be disabled (as shown at $t_{14}$ in FIG. 8B by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 8B.

The sensing circuitry 750 illustrated in FIG. 7A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 714-1 to conduct and activating the AND-inv control signal causes transistor 714-2 to conduct. In each case, asserting the appropriate inverted control signal can flip the sense amplifier and cause the result initially stored in the sense amplifier 706 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 7A can perform a NOT (e.g., invert) operation by putting the non-inverted data value into the dynamic latch of the accumulator and using that data to invert the data value in the sense amplifier 706. As previously mentioned, activating the ORinv control signal causes transistor 714-1 to conduct and activating the ANDinv control signal causes transistor 714-2 to conduct. The ORinv and/or ANDinv control signals are used in implementing the NOT function, as described further below:

---

Copy Row X into the Accumulator
    Deactivate EQ
    Open Row X
    Fire Sense Amps (after which Row X data resides in the sense amps)
    Activate LOAD (sense amplifier data (Row X) is transferred to nodes S1 and S2 of the Accumulator and resides there dynamically
    Deactivate LOAD
    Activate ANDinv and ORinv (which puts the compliment data value on the data lines)
        This results in the data value in the sense amplifier being inverted (e.g., the sense amplifier latch is flipped)
        This operation leaves the data in the accumulator unchanged
    Deactivate ANDinv and ORinv
    Close Row X
    Precharge

---

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 706 and copied into the dynamic latch, a compliment version of the data value in the dynamic latch of the accumulator can be placed on the data line and thus transferred to the sense amplifier 706 by enabling (e.g., causing transistor to conduct) and disabling the invert transistors (e.g., ANDinv and ORinv). This results in the sense amplifier 706 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 750 shown in FIG. 7A initially stores the result of the AND, OR, and NOT logical operations in the sense amplifier 706 (e.g., on the sense amplifier nodes), these logical operation results can be communicated easily and quickly to any enabled row, any row activated after the logical operation is complete, and/or into the secondary latch of the compute component 731. The sense amplifier 706 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 706 fires.

When performing logical operations in this manner, the sense amplifier 706 can be pre-seeded with a data value from the dynamic latch of the accumulator to reduce overall current utilized because the sense amps 706 are not at full rail voltages (e.g., supply voltage or ground/reference voltage) when accumulator function is copied to the sense amplifier 706. An operation sequence with a pre-seeded sense amplifier 706 either forces one of the data lines to the reference voltage (leaving the complementary data line at $V_{DD}/2$, or leaves the complementary data lines unchanged. The sense amplifier 706 pulls the respective data lines to full rails when the sense amplifier 706 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 723 can be used for shifting data values stored in memory cells coupled to a particular pair of complementary data lines to the sensing circuitry 750 (e.g., sense amplifier 706) corresponding to a different pair of complementary data lines (e.g., such as a sense amplifier 706 corresponding to a left or right adjacent pair of complementary data lines. As used herein, a sense amplifier 706 corresponds to the pair of complementary data lines to which the sense amplifier is coupled when isolation transistors 721-1 and 721-2 are conducting. The SHIFT operations (right or left) do not pre-copy the Row X data value into the accumulator. Operations to shift right Row X can be summarized as follows:

---

Deactivate Norm and Activate Shift
Deactivate EQ
Open Row X
Fire Sense Amps (after which shifted Row X data resides in the sense amps)
Activate Norm and Deactivate Shift
Close Row X
Precharge

---

In the pseudo code above, "Deactivate Norm and Activate Shift" indicates that a NORM control signal goes low causing isolation transistors 721-1 and 721-2 of the shift circuitry 723 to not conduct (e.g., isolate the sense amplifier from the corresponding pair of complementary data lines). The SHIFT control signal goes high causing isolation transistors 721-3 and 721-4 to conduct, thereby coupling the sense amplifier 706 to the left adjacent pair of complementary data lines (e.g., on the memory array side of non-conducting isolation transistors 721-1 and 721-2 for the left adjacent pair of complementary data lines).

After the shift circuitry 723 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 706.

In the pseudo code above, "Activate Norm and Deactivate Shift" indicates that a NORM control signal goes high causing isolation transistors 721-1 and 721-2 of the shift circuitry 723 to conduct (e.g., coupling the sense amplifier to the corresponding pair of complementary data lines), and the SHIFT control signal goes low causing isolation transistors 721-3 and 721-4 to not conduct and isolating the sense amplifier 706 from the left adjacent pair of complementary data lines (e.g., on the memory array side of non-conducting isolation transistors 721-1 and 721-2 for the left adjacent pair of complementary data lines). Since Row X is still active, the Row X data value that has been shifted right is transferred to Row X of the corresponding pair of complementary data lines through isolation transistors 721-1 and 721-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge

---

In the pseudo code above, "Activate Norm and Deactivate Shift" indicates that a NORM control signal goes high causing isolation transistors 721-1 and 721-2 of the shift circuitry 723 to conduct, and the SHIFT control signal goes low causing isolation transistors 721-3 and 721-4 to not conduct. This configuration couples the sense amplifier 706 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 750 is stored in the sense amplifier 706.

In the pseudo code above, "Deactivate Norm and Activate Shift" indicates that a NORM control signal goes low causing isolation transistors 721-1 and 721-2 of the shift circuitry 723 to not conduct (e.g., isolate the sense amplifier from the corresponding pair of complementary data lines), and the SHIFT control signal goes high causing isolation transistors 721-3 and 721-4 to conduct coupling the sense amplifier to the left adjacent pair of complementary data lines (e.g., on the memory array side of non-conducting isolation transistors 721-1 and 721-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 9:
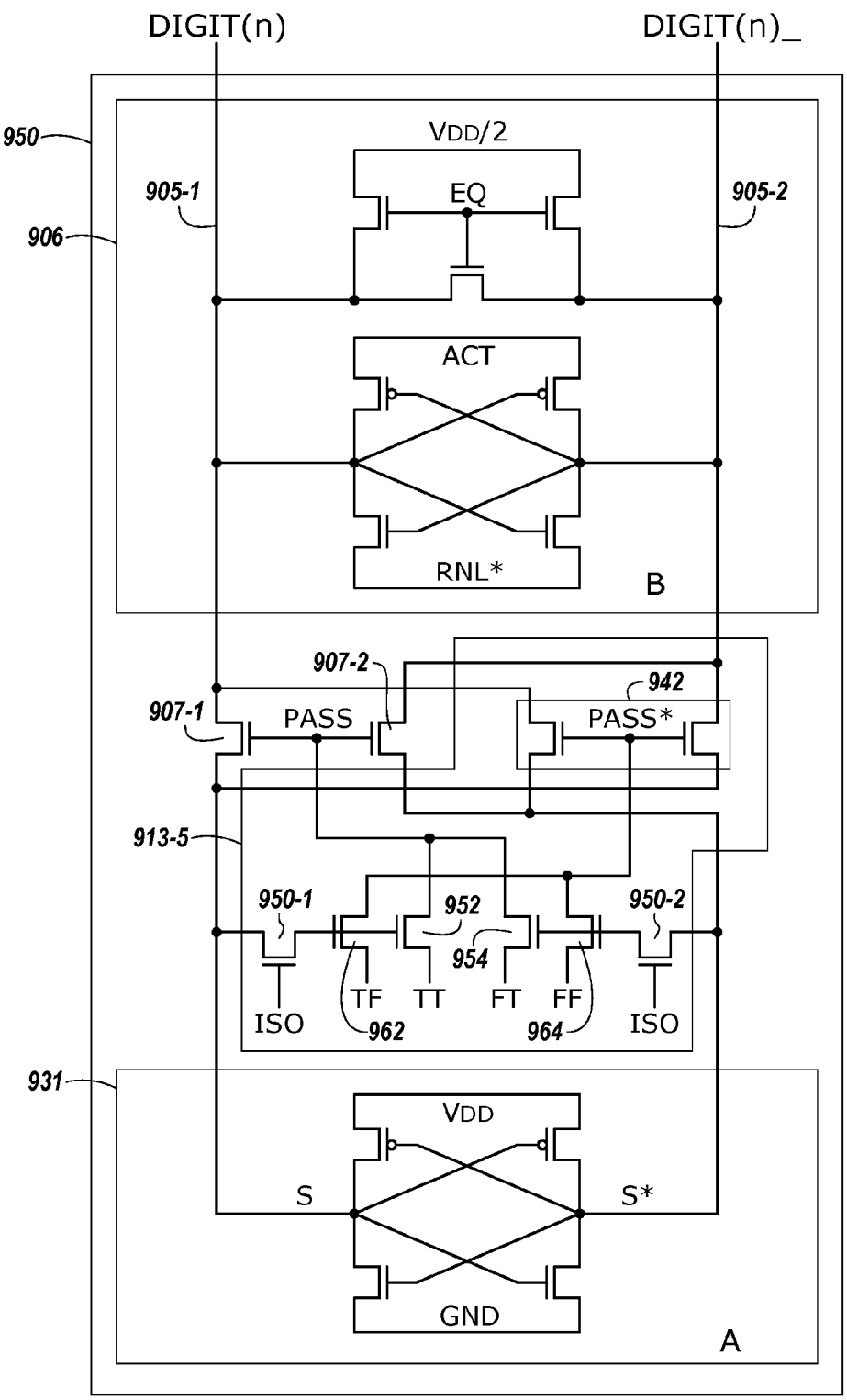
FIG. 9 is a schematic diagram illustrating sensing circuitry having selectable logical operation selection logic in accordance with a number of embodiments of the present disclosure.

FIG. 9 is a schematic diagram illustrating sensing circuitry having selectable logical operation selection logic in accordance with a number of embodiments of the present disclosure. FIG. 9 shows a sense amplifier 906 coupled to a pair of complementary sense lines 905-1 and 905-2, and a compute component 931 coupled to the sense amplifier 906 via pass gates 907-1 and 907-2. The gates of the pass gates 907-1 and 907-2 can be controlled by a logical operation selection logic signal, PASS, which can be output from logical operation selection logic 913-5. FIG. 9 shows the compute component 931 labeled "A" and the sense amplifier 906 labeled "B" to indicate that the data value stored in the compute component 931 is the "A" data value and the data value stored in the sense amplifier 906 is the "B" data value shown in the logic tables illustrated with respect to FIG. 10.

The sensing circuitry 950 illustrated in FIG. 9 includes logical operation selection logic 913-5. In this example, the logic 913-5 comprises swap gates 942 controlled by a logical operation selection logic signal PASS*. The logical operation selection logic 913-5 also comprises four logic selection transistors: logic selection transistor 962 coupled between the gates of the swap transistors 942 and a TF signal control line, logic selection transistor 952 coupled between the gates of the pass gates 907-1 and 907-2 and a TT signal control line, logic selection transistor 954 coupled between the gates of the pass gates 907-1 and 907-2 and a FT signal control line, and logic selection transistor 964 coupled between the gates of the swap transistors 942 and a FF signal control line. Gates of logic selection transistors 962 and 952 are coupled to the true sense line (e.g., 905-1) through isolation transistor 950-1 (having a gate coupled to an ISO signal control line), and gates of logic selection transistors 964 and 954 are coupled to the complementary sense line (e.g., 905-2) through isolation transistor 950-2 (also having a gate coupled to an ISO signal control line).

Logic selection transistors 952 and 954 are arranged similarly to transistor 707-1 (coupled to an AND signal control line) and transistor 707-2 (coupled to an OR signal control line) respectively, as shown in FIG. 7A. Operation of logic selection transistors 952 and 954 are similar based on the state of the TT and FT selection signals and the data values on the respective complementary sense lines at the time the ISO signal is asserted. Logic selection transistors 962 and 964 also operate in a similar manner to control continuity of the swap transistors 942. That is, to OPEN (e.g., turn on) the swap transistors 942, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 942 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 9 are summarized in the logic table illustrated in FIG. 10.

Figure 10:
FIG. 10 is a logic table illustrating selectable logic operation results implemented by a sensing circuitry in accordance with a number of embodiments of the present disclosure.

FIG. 10 is a logic table illustrating selectable logic operation results implementable by the sensing circuitry shown in FIG. 9 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 906 and compute component 931. The four control signals, in conjunction with a particular data value present on the complementary sense lines, controls the continuity of the pass gates 907-1 and 907-2 and swap transistors 942, which in turn affects the data value in the compute component 931 and/or sense amplifier 906 before/after firing. The capability to selectably control continuity of the swap transistors 942 facilitates implementing logical operations involving inverse data values (e.g., inverse operands and/or inverse result), among others.

The logic table illustrated in FIG. 10 shows the starting data value stored in the compute component 931 shown in column A at 1044, and the starting data value stored in the sense amplifier 906 shown in column B at 1045. The other 3 top column headings (NOT OPEN, OPEN TRUE, and OPEN INVERT) in the logic table of FIG. 10 refer to the continuity of the pass gates 907-1 and 907-2, and the swap transistors 942, which can respectively be controlled to be OPEN or CLOSED depending on the state of the four logic selection control signals (e.g., TF, TT, FT, and FF), in conjunction with a particular data value present on the pair of complementary sense lines 905-1 and 905-2 when the ISO control signal is asserted. The "Not Open" column corresponds to the pass gates 907-1 and 907-2 and the swap transistors 942 both being in a non-conducting condition, the "Open True" corresponds to the pass gates 907-1 and 907-2 being in a conducting condition, and the "Open Invert" corresponds to the swap transistors 942 being in a conducting condition. The configuration corresponding to the pass gates 907-1 and 907-2 and the swap transistors 942 both being in a conducting condition is not reflected in the logic table of FIG. 10 since this results in the sense lines being shorted together.

Via selective control of the continuity of the pass gates 907-1 and 907-2 and the swap transistors 942, each of the three columns of the first set of two rows of the upper portion of the logic table of FIG. 10 can be combined with each of the three columns of the second set of two rows below the first set to provide 3×3=9 different result combinations, corresponding to nine different logical operations, as indicated by the various connecting paths shown at 1075. The nine different selectable logical operations that can be implemented by the sensing circuitry 950 are summarized in the logic table illustrated in FIG. 10.

The columns of the lower portion of the logic table illustrated in FIG. 10 show a heading 1080 that includes the state of logic selection control signals. For example, the state of a first logic selection control signal is provided in row 1076, the state of a second logic selection control signal is provided in row 1077, the state of a third logic selection control signal is provided in row 1078, and the state of a fourth logic selection control signal is provided in row 1079. The particular logical operation corresponding to the results is summarized in row 1047.

As such, the sensing circuitry shown in FIG. 9 can be used to perform various logical operations as shown in FIG. 10. For example, the sensing circuitry 950 can be operated to perform various logical operations (e.g., AND and OR logical operations) in association with comparing data patterns in memory in accordance with a number of embodiments of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method, comprising:
   protecting a number of data values stored in a respective number of memory cells coupled to a sense line of an array via a parity value corresponding to the number of data values that is determined without transferring data from the array via an input/output (I/O) line; and
   storing the parity value in another memory cell coupled to the sense line;
   updating the parity value responsive to updated data being written to a particular memory cell of the number of memory cells, wherein updating the parity value includes removing, from the parity value determination, the data value stored in the particular memory cell;
   wherein removing, from the parity value determination, the data value stored in the particular memory cell comprises:
      sensing the data value stored in the particular memory cell;
      performing an XOR operation on the data value stored in the particular memory cell and the parity value to obtain an updated parity value; and
      storing the updated parity value in the another memory cell;
   in response to the updated data being written to the particular memory cell, including an effect of the updated data on the updated parity value by:
      performing an XOR operation on the updated data and the updated parity value to obtain a newly updated parity value; and
      storing the newly updated parity value in the another memory cell.

2. The method of claim 1, wherein protecting the number of data values comprises performing, using sensing circuitry, exclusive OR (XOR) operations on the number of data values stored in the respective number of memory cells to determine the parity value.

3. The method of claim 2, wherein performing the XOR operations without transferring data from the array via an I/O line comprises performing the XOR operations without performing a sense line address access.

4. The method of claim 1, further comprising delaying writes to the respective number of memory cells during a compute transaction until the compute transaction has completed.

5. The method of claim 1, further comprising recovering data stored in a particular memory cell of the respective number of memory cells determined to contain an error.

6. The method of claim 5, wherein recovering data stored in the particular memory cell further comprises performing additional XOR operations on data values stored in the respective number of memory cells other than the particular memory cell and the parity value.

7. The method of claim 6, wherein recovering data stored in the particular memory cell further comprises storing a result from the additional XOR operations in the particular memory cell.

8. The method of claim 5, wherein recovering data stored in the particular memory cell further comprises detecting the error during a compute transaction and recovering the data before restarting the compute transaction.

9. The method of claim 2, wherein performing XOR operations comprises performing a first XOR operation on a data value stored in a memory cell coupled to a first access line of the number of memory cells and a data value stored in a memory cell of the number of memory cells coupled to a second access line.

10. The method of claim 9, wherein performing XOR operations comprises performing a second XOR operation on a result of the first XOR operation and a data value stored in a memory cell coupled to a third access line of the number of memory cells.

11. The method of claim 10, comprising performing subsequent corresponding XOR operations on a previous result from a preceding XOR operation with a subsequent data value stored in a subsequent memory cell coupled to a subsequent access line.

12. An apparatus, comprising:
   an array of memory cells comprising a plurality of sense lines each coupled to corresponding sensing circuitry and having a number of memory cells coupled thereto, wherein each of the number of memory cells are coupled to one of a respective number of access lines; and
   wherein the sensing circuitry is operable to:
      perform, on a sense line by sense line basis, a number of exclusive OR (XOR) operations on data values stored in the number of memory cells coupled to a particular sense line to determine parity values corresponding to the data stored in the memory cells of the respective plurality of sense lines without transferring data from the array via an input/output (I/O) line; and store the determined parity values in additional memory cells coupled to the respective sense lines.

13. The apparatus of claim 12, wherein the apparatus includes a controller configured to provide control signals to the sensing circuitry to perform the number of XOR operations.

14. The apparatus of claim 13, wherein the sensing circuitry corresponding to the respective plurality of sense lines each comprises a sense amplifier and a compute component, and wherein the plurality of sense lines each have a corresponding complementary sense line also coupled to the corresponding sense amplifier and to the corresponding compute component.

15. The apparatus of claim 12, wherein the additional memory cells coupled to the respective sense lines are coupled to a same access line.

16. The apparatus of claim 12, wherein the sensing circuitry is operated to:
perform a first AND operation on the data values;
perform an invert operation on the data values;
perform an OR operation on the data values; and
perform a second AND operation on a result from the first AND operation and a result from the OR operation.

17. An apparatus, comprising:
an array storing data in each of a number of memory cells coupled to a sense line;
sensing circuitry coupled to the sense line and operable to:
perform an XOR operation on a data value stored in a first memory cell and a data value stored in a second memory cell of the number of memory cells resulting in a first resultant value without enabling a decode line corresponding to the sensing circuitry; and
perform an XOR operation on the first resultant value and a data value stored in a third memory cell of the number of memory cells resulting in a second resultant value without enabling the decode line.

18. The apparatus of claim 17, wherein the sensing circuitry is operable toperform a number of subsequent XOR operations on resultant values from prior XOR operations and data values stored in remaining memory cells of the number of memory cells withoutenabling the decode line.

19. The apparatus of claim 17, wherein the sensing circuitry is operable to repeat performance of XOR operations until a respective XOR operation has been performed on each of the number of memory cells coupled to the sense line; and wherein an XOR output value from the XOR operations is a parity value corresponding to the data values stored in the number of memory cells.

20. The apparatus of claim 17, wherein the apparatus comprises a controller configured to cause a rollback to a prior state of the data values stored in the number of memory cells when an error is detected.

21. An apparatus, comprising:
an array of memory cells storing data in each of a number of memory cells coupled to a sense line;
sensing circuitry coupled to the array and operable to:
perform an XOR operation on the data stored in each of the number of memory cells without activating a decode signal, wherein the XOR operation includes:
performing a NAND operation on data values stored in a first memory cell and a second memory cell coupled to the sense line;
performing an OR operation on the data values; and
performing an AND operation on a result of the NAND operation and a result of the OR operation;
determine a parity value corresponding to the data based on a result of the AND operation; and
store the determined first parity value in an additional memory cell coupled to the sense line.

22. The apparatus of claim 21, wherein the NAND operation performed on the data values stored in the first memory cell and the second memory cell comprises:
loading a compute component coupled to the sense line with the data value stored in the first memory cell; and
enabling an access line to which the second memory cell is coupled and a control line to which a pass transistor is coupled.

23. The apparatus of claim 21, wherein the sensing circuitry is operable to invert an output value resulting from enabling the access line to which the second memory cell is coupled and the particular control signal to which the pass transistor is coupled.

24. The apparatus of claim 21, wherein the OR operation performed on the data values stored in the first memory cell and the second memory cell comprises:
loading a compute component coupled to the sense line with the data value stored in the first memory cell; and
enabling an access line to which the second memory cell is coupled and a control signal line to which an additional pass transistor is coupled.

25. The apparatus of claim 24, wherein loading the compute component comprises:
enabling an access line to which the first memory cell is coupled; and
enabling the control signal line to which the pass transistor is coupled and the control signal line to which the additional pass transistor is coupled.

26. The apparatus of claim 21, wherein the sense line is one sense line of a pair of complementary sense lines and the one sense line of the pair of complementary sense lines is coupled to the pass transistor and another sense line of the pair of complementary sense lines is coupled to the additional pass transistor.

27. That apparatus of claim 23, wherein the output value is stored in a third memory cell coupled to the sense line.

28. The apparatus of claim 27, wherein the AND operation comprises:
enabling an access line to which the third memory cell storing the output value is coupled; and
activating the control signal to which the pass transistor is coupled.

29. The apparatus of claim 28, wherein the result of the AND operation is written to a fourth memory cell by enabling an access line to which the fourth memory cell is coupled and copies the data value stored in the compute component to the fourth memory cell.

30. A method, comprising:
determining, using sensing circuitry coupled to a pair of complementary sense lines of an array of memory cells, a parity value protecting data stored in a number of memory cells coupled to a first sense line of the pair without transferring the data from the array using an input/output line, wherein determining the parity value comprises:
performing an AND operation on: a resultant value of a NAND operation performed on a first data value stored in a first memory cell coupled to the first sense line and a second data value stored in a second memory cell coupled to the first sense line; and a resultant value of an OR operation performed on the first data value and the second data value;

wherein performing the NAND operation includes:
  loading a compute component of the sensing circuitry with the first data value; and
  enabling an access line to which the second memory cell is coupled and a first pass transistor which results in a data value corresponding to an AND operation performed on the first and second data values being stored in the compute component, wherein the first pass transistor has a first source/drain region coupled to the first sense line;
  inverting the data value stored in the compute component, the inverted data value being the resultant value of the NAND operation;

writing the resultant value of the NAND operation to a third memory cell coupled to the first sense line;

wherein performing the OR operation includes:
  loading the compute component with the first data value; and
  enabling the access line to which the second memory cell is coupled and a second pass transistor having a first source/drain region coupled to a second sense line of the pair of complementary sense lines such that the resultant value of the OR operation is stored in the compute component; and wherein performing the AND operation on the resultant value of the NAND operation and the resultant value of the OR operation includes:
  enabling an access line to which the third memory cell storing the resultant value of the NAND operation is coupled; and
  enabling the first pass transistor which results in a resultant value of the AND operation performed on the NAND resultant value and the OR resultant value being stored in the compute component, wherein the resultant value is a parity value corresponding to the first and second data values.

31. The method of claim 30, wherein loading the compute component with the first data value comprises transferring the first data value from the first memory cell to the compute component by enabling an access line to which the first memory cell is coupled along with enabling the first and the second pass transistors.

32. The method of claim 30, wherein inverting the data value stored in the compute component comprises enabling an invert transistor coupled to a cross coupled latch of the compute component.

33. The method of claim 30, wherein performing the AND operation on the resultant value of the NAND operation and the resultant value of the OR operation comprises a first XOR performed on the first and second data values, and wherein determining the parity value protecting the data stored in the number of memory cells includes performing a second XOR operation on a third data value stored in a memory cell coupled to the first sense line and a result of the first XOR operation performed on the first and second data values.

34. The method of claim 33, including writing the parity value to a parity memory cell coupled to the first sense line, wherein the parity memory cell is a different memory cell than the number of memory cells.

35. The method of claim 33, wherein determining the parity value includes subsequently performing, for each additional memory cell storing a data value to be protected by the parity value, an XOR operation on the respective data value and the resultant value of an XOR operation previously performed on protected data values.

36. The method of claim 35, wherein determining the parity value includes repeating the XOR operations until the data values stored in each memory cell of the number of memory cells to be protected by the parity value has had an XOR operation performed thereon.

* * * * *